United States Patent
Matsushita

(10) Patent No.: US 11,304,348 B2
(45) Date of Patent: Apr. 12, 2022

(54) SURFACE MOUNTING DEVICE AND AN INFORMING METHOD

(71) Applicant: YAMAHA HATSUDOKI KABUSHIKI KAISHA, Iwata (JP)

(72) Inventor: Yoichi Matsushita, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 79 days.

(21) Appl. No.: 16/756,457

(22) PCT Filed: Oct. 31, 2017

(86) PCT No.: PCT/JP2017/039294
§ 371 (c)(1),
(2) Date: Apr. 15, 2020

(87) PCT Pub. No.: WO2019/087285
PCT Pub. Date: May 9, 2019

(65) Prior Publication Data
US 2021/0161043 A1    May 27, 2021

(51) Int. Cl.
*H05K 13/04* (2006.01)
*H05K 13/08* (2006.01)
*H05K 13/00* (2006.01)

(52) U.S. Cl.
CPC ..... *H05K 13/0419* (2018.08); *H05K 13/0015* (2013.01); *H05K 13/081* (2018.08); *H05K 13/086* (2018.08)

(58) Field of Classification Search
None
See application file for complete search history.

(56) References Cited

U.S. PATENT DOCUMENTS 6,332,536 B2 * 12/2001 Easton ............... H05K 13/0417
                                              206/459.5
10,798,860 B2 * 10/2020 Yasuhira ........... H05K 13/0419
(Continued)

FOREIGN PATENT DOCUMENTS

CN    203151941 U  *  8/2013
CN    203151941 U      8/2013
(Continued)

OTHER PUBLICATIONS

An Office Action mailed by China National Intellectual Property Administration dated Oct. 10, 2020, which corresponds to Chinese Patent Application No. 201780094905.1 and is related to U.S. Appl. No. 16/756,457 with English language translation.
(Continued)

*Primary Examiner* — Carl J Arbes
(74) *Attorney, Agent, or Firm* — Studebaker & Brackett PC

(57) ABSTRACT

An informing device includes a loading section feeding automatically a subsequent component tape that is preset in the tape feeder when the component tape that is being fed by the feeding device has no component. A controller is configured to determine whether the component tape that is being fed by the feeding device and the subsequent component tape are present in the tape feeder or only one of the component tape and the subsequent component tape is present in the tape feeder based on a management table, and configured to control a display section to inform that the subsequent component tape can be preset in the tape feeder before the subsequent component tape is preset when only one of the component tapes is present in the tape feeder.

13 Claims, 20 Drawing Sheets

(56) References Cited

U.S. PATENT DOCUMENTS

| | | | |
|---|---|---|---|
| 10,912,240 B2* | 2/2021 | Michizoe | H05K 13/0417 |
| 2009/0229117 A1* | 9/2009 | Saho | H05K 13/084 |
| | | | 29/739 |
| 2015/0110588 A1* | 4/2015 | Ohyama | H05K 13/0417 |
| | | | 414/411 |
| 2015/0212519 A1* | 7/2015 | Sumi | H05K 13/0215 |
| | | | 700/115 |
| 2018/0049353 A1 | 2/2018 | Michizoe et al. | |

FOREIGN PATENT DOCUMENTS

| | | |
|---|---|---|
| CN | 106852112 A | 6/2017 |
| CN | 107211563 A | 9/2017 |
| JP | 2000-209000 A | 7/2000 |
| JP | 2006-222148 A | 8/2006 |
| JP | 2006222148 A * | 8/2006 |
| JP | 2011-204824 A | 10/2011 |
| JP | 2014-011328 A | 1/2014 |
| JP | 2014-110322 A | 6/2014 |
| JP | 2014110322 A * | 6/2014 |
| JP | 2014-236126 A | 12/2014 |
| JP | 2016-092060 A | 5/2016 |
| WO | 2016/157515 A1 | 10/2016 |
| WO | 2016157515 A1 * | 10/2016 |

OTHER PUBLICATIONS

International Search Report issued in PCT/JP2017/039294; dated Feb. 6, 2018.

An Office Action; "Notice of Reasons for Refusal," mailed by the Japanese Patent Office dated Apr. 13, 2021, which corresponds to Japanese Patent Application No. 2019-550035 and is related to U.S. Appl. No. 16/756,457 with English language translation.

An Office Action; "Notice of Reasons for Refusal," mailed by the Japanese Patent Office dated Jan. 5, 2021, which corresponds to Japanese Patent Application No. 2019-550035 and is related to U.S. Appl. No. 16/756,457 with English language translation.

* cited by examiner

FIG.12
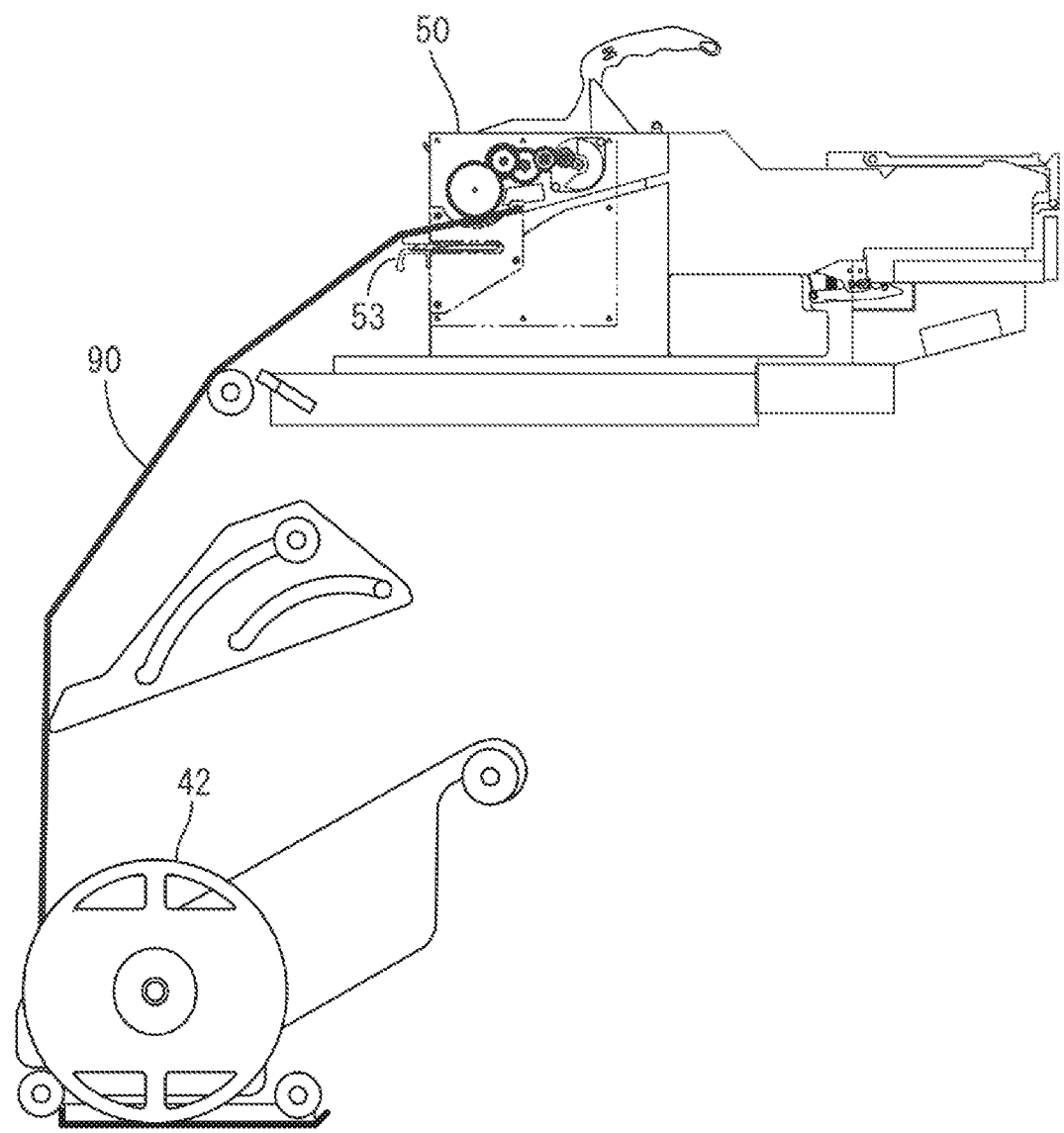
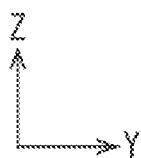

FIG.19

| LINE NAME | MACHINE NAME | F/R | SETTING POSITION | COMPONENT NUMBER | COMPONENT NAME | PRESETTING IS POSSIBLE | XXXXX |
|---|---|---|---|---|---|---|---|
| Line01 | YXXXX-- | Front | F01 | 1 | PARTS01 | | XXXXX |
| Line01 | YXXXX-- | Front | F02 | 2 | PARTS02 | | XXXXX |
| Line01 | YXXXX-- | Front | F03 | 3 | PARTS03 | * | XXXXX |
| Line01 | YXXXX-- | Front | F04 | 4 | PARTS04 | | XXXXX |
| Line01 | YXXXX-- | Front | F05 | 5 | PARTS05 | | XXXXX |
| Line01 | YXXXX-- | Front | F06 | 6 | PARTS06 | | XXXXX |
| Line01 | YXXXX-- | Front | F07 | 7 | PARTS07 | | XXXXX |
| Line01 | YXXXX-- | Front | F08 | 8 | PARTS08 | * | XXXXX |
| Line01 | YXXXX-- | Front | F09 | 9 | PARTS09 | | XXXXX |
| Line01 | YXXXX-- | Front | F10 | 10 | PARTS10 | * | XXXXX |
| Line01 | YXXXX-- | Front | F11 | 11 | PARTS11 | | XXXXX |
| Line01 | YXXXX-- | Front | F12 | | | | XXXXX |
| Line01 | YXXXX-- | Front | F13 | | | | XXXXX |
| Line01 | YXXXX-- | Front | F14 | | | | XXXXX |
| Line01 | YXXXX-- | Front | F15 | | | | XXXXX |
| Line01 | YXXXX-- | Front | F16 | | | | XXXXX |
| Line01 | YXXXX-- | Front | F17 | | | | XXXXX |

COMPONENT REMAINING NUMBER MONITOR 170
171

SURFACE MOUNTING DEVICE AND AN INFORMING METHOD

CROSS-REFERENCE TO RELATED APPLICATION

This application is a National Stage of International Patent Application No. PCT/JP2017/039294, filed Oct. 31, 2017, the entire content of which is incorporated herein by reference.

BACKGROUND

Technical Field

The technology described herein relates to an informing device of informing information on a tape feeder and an informing method.

Background Art

There has been known a tape feeder that feeds a component tape that includes components thereon to a component supply position to supply the components to a component mounting device. There have been known some tape feeders in which two component tapes can be present at the same time, as described, for example, in Japanese Unexamined Patent Publication No. 2014-11328.

Specifically, the feeder 2 described in Japanese Unexamined Patent Publication No. 2014-11328 includes a tape chute 2S in which the supply tape 60 (corresponding to a component tape) is inserted and a detachable tape presser plate 38 that presses the supply tape 60 on the tape chute 2S from the above. When the component tape 60 inserted in the tape chute 2S (corresponds to a first tape feed path) is automatically loaded and used for mounting the components in the feeder 2, an operator detaches the tape presser plate 38 and lifts up an intermediate portion of the supply tape 60 so as to travel above the tape presser plate 38 (corresponds to a second tape feed path).

Next, the operator inserts a top end portion 60a' of the supply tape 60' to be used next in the tape chute 2S and attaches the tape presser plate 38 from the above. Thus, the subsequent supply tape 60' is previously inserted in the tape chute 2S before all of the electronic components included in the currently used supply tape 60 are used. In the following description, the operation of previously inserting the subsequent supply tape 60' is referred to as "presetting".

If the control device 80 of the electronic component mounting device 1 determines all of the electronic components included in the currently used supply tape 60 are used, the preset subsequent supply tape 60' is automatically loaded.

SUMMARY

In the automatic loading of the subsequent supply tape 60', if another subsequent supply tape is not preset before all of the electronic components included in the component tape 60' are used, the mounting operation of the component mounting device may be stopped due to the component shortages. However, the operator is not always near the feeder 2 and often works in another place. Therefore, the operator is less likely to know that the subsequent supply tape 60' has been automatically loaded (in other words, a further subsequent supply tape can be preset).

The specification discloses the technology of improving utility for an operator's operations of presetting a component tape in a tape feeder that automatically loads a preset component tape.

An informing device described herein is an informing device informing information on a tape feeder that supplies a component to a component mounting device by feeding a component tape including the component to a component supply position. The informing device includes a feeding device feeding the component tape toward the component supply position, a loading section automatically feeding a subsequent component tape that is preset in the tape feeder to the feeding device when the component tape that is being fed by the feeding device has no component, an informing section, and a controller. The controller is configured to determine whether the component tape that is being fed by the feeding device and the subsequent component tape are present in the tape feeder or only one of the component tape and the subsequent component tape is present in the tape feeder based on management information for managing presence of the component tape in the tape feeder, and configured to control the informing section to inform that the subsequent component tape can be preset in the tape feeder before the subsequent component tape is preset when only the one of the component tape and the subsequent component tape is present in the tape feeder.

The above informing device informs that the subsequent component tape can be preset in the tape feeder if only one component tape is in the tape feeder. Thus, the operator can know that the subsequent component tape can be preset. According to the informing device, in the tape feeder that performs loading of the preset component tape, utility for the user who presets the component tape can be improved.

The controller may be configured to control the informing section to keep informing that the subsequent component tape can be preset in the tape feeder until the subsequent component is preset.

The informing device keeps displaying that presetting is possible. Therefore, when the operator stops by the informing device for some work, the operator can easily know that the subsequent component tape can be preset. The operator who knows that the subsequent component tape can be preset can preset the component tape while doing another work. Therefore, the operator need not quit another work to go to the place where the tape feeder is installed every time the tape feeder is in the state in which presetting is possible. According to the informing device, the working efficiency of the operator who presets the component tape can be improved.

The tape feeder may include a tape feed path along which the component tape is fed. When only the one component tape is present in the tape feeder and the one component tape is preset in the tape feed path, the controller may be configured to control the informing section to inform that the subsequent component tape can be preset in the tape feed path after the one component tape is fed by the loading section and reaches the feeding device.

According to the above informing device, the operator presets the subsequent component tape after the loading of a preceding component tape is completed. This reduces possibility of presetting of the subsequent component tape during the loading of the preceding component tape.

The tape feed path may include a first tape feed path in which the subsequent component tape is preset, a second tape feed path that is next to the first tape feed path, and a switching section configured to switch the tape feed path for the component tape that is fed by the loading section and reaches the feeding device from the first tape feed path to the second tape feed path. When only the one component tape is present in the tape feeder and the one component tape is preset in the first tape feed path, the controller may be configured to control the informing section to inform that the subsequent component tape can be preset in the first tape feed path after the one component tape is fed by the loading section and reaches the feeding device.

According to the informing device, in the tape feeder including the branched tape feed paths including the first tape feed path and the second tape feed path, the operator can know that the subsequent component tape can be preset in the first tape feed path.

The controller may be configured to control the informing section to inform that the subsequent component tape can be preset in the tape feeder and also inform information on a number of remaining components stored in the component tape that is fed to the feeding device by the loading section and supplying the component to the component mounting device.

If the number of remaining components included in the component tape that is fed to the feeding device (namely, the component tape that is supplying the components) is small, it is desirable for the operator to preset the subsequent component tape as soon as possible.

According to the informing device, the operator can know the number of remaining components included in the component tape that is supplying the components from the information relating the number of remaining components. Therefore, if the number of remaining components is small, presetting is performed promptly and the possibility of stopping the mounting operation of the component mounting device due to the component shortage is reduced. Furthermore, according to the informing device, when the subsequent component tape can be preset in several tape feeders, one of the tape feeders in which the subsequent component tape is to be preset first can be determined based on the information relating the number of remaining components.

The tape feeder may include a light emitting section. The controller may be configured to control the light emitting section to light, blink, or flicker before the subsequent tape is preset in the tape feed path when only the one component tape is present in the tape feeder.

The informing device described above displays that the subsequent component tape can be preset in the tape feeder with lighting, blinking, or flickering of the light emitting section of the tape feeder in addition to the display on the informing section. Therefore, the operator knows whether the subsequent component tape can be preset or not more easily.

The controller may be configured to control the informing section not to inform that the subsequent component tape can be preset in the tape feeder until mounting of the components on a predefined number of boards is completed after the component mounting device starts mounting the components on a first board.

When the production of the boards is started, the components are supplied for a while from the component tape that has been set first. It is preferable to set first component tapes in all of the tape feeders, respectively, and start production and perform presetting thereafter. If it is informed that the subsequent component tape can be preset in this case, such informing may be excessive in some cases.

In the above informing device, the controller controls not to inform that presetting is possible until mounting of the components on a predefined number of boards is completed after the component mounting device starts mounting the components on a first board.

The controller may be configured to control the informing section not to inform that the subsequent component tape can be preset in the tape feeder when the component mounting device can complete mounting of the components on a scheduled number of boards with the components stored in the component tape that is fed to the feeding device by the loading section.

If the component mounting device can complete the mounting of the components onto the scheduled number of boards with the components stored in the component tape that is fed to the feeding device, the subsequent component tape need not be preset. In such a case, the display indicating that presetting is possible may make an operator to perform unnecessary presetting.

The above informing device does not inform that a subsequent component tape can be preset. This prevents an operator from performing unnecessary presetting.

The component tape may be wound around a tape reel. When the tape reel around which the component tape preset in the tape feeder has a diameter greater than a reference value, the controller may be configured to control the informing section to inform that the subsequent component tape can be preset in the tape feeder after the component tape is fed by the loading section and reaches the feeding device and the components are supplied from the component tape and when a length of a remaining component tape becomes a certain length or smaller.

The component tape is normally fed to the tape feeder while being wound around a tape reel. However, the tape feeder may have a small space for receiving the tape reel. If the reel has a small diameter (the reel having a diameter smaller than a reference value), two reels can be installed in the space at the same time. However, if the reel has a large diameter (the reel having a diameter of the reference value or larger), two reels may not be installed in the space at the same time.

Therefore, in the above informing device, the components are supplied from the component tape that is wound around the large diameter tape reel and if a length of the remaining component tape is a predefined length or smaller, the indication that presetting is possible is informed.

In such a case, the operator who knows that presetting is possible releases the rest of the component tape from the tape reel and detaches only the tape reel. This provides a space that can receive the tape reel of the subsequent component tape. Then, the operator installs the tape reel of the subsequent component tape and presets the component tape that is wound around the tape reel.

Thus, according to the above informing device, even if two large diameter tape reels cannot be installed at the same time, the operator can preset the subsequent component tape before the number of components included in the component tape that is supplying the components becomes zero.

A method of informing with an informing device described herein is a method of informing information on a tape feeder that supplies components to a component mounting device by feeding a component tape including the components to a component supply position. The method includes a loading process of automatically feeding the subsequent component tape that is preset in the tape feeder when the component tape that is being fed by the feeding device for feeding the component tape to the component supply position has no component, and an informing process of determining whether the component tape fed by the feeding device and the subsequent component tape are present in the tape feeder or only one component tape is present in the tape feeder based on management information for managing presence of the component tape in the tape feeder, and informing with the informing device that the subsequent component tape can be preset in the tape feeder before the subsequent component tape is preset when only the one component tape is present in the tape feeder.

According to the above informing method, utility for an operator's operations of presetting a component tape in a tape feeder that automatically loads a preset component tape can be improved.

BRIEF DESCRIPTION OF THE DRAWINGS

FIG. 12 is a schematic view of a tape component supply device;
FIG. 19 is a schematic view of a component remaining number monitoring screen according to a fourth embodiment.

DETAILED DESCRIPTION

First Embodiment

Figure 1:
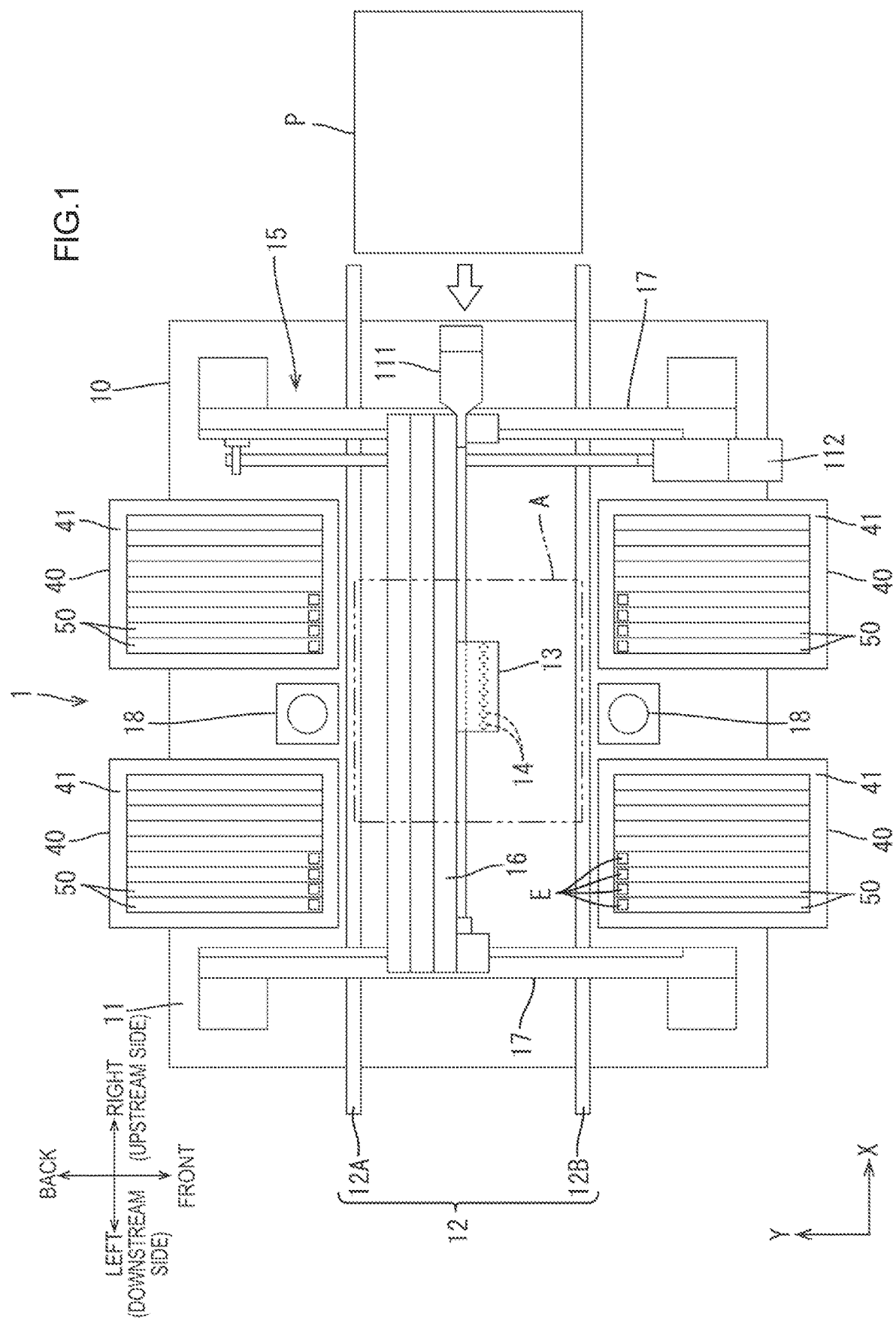
FIG. 1 is an upper view of a surface mounting device according to a first embodiment.

A first embodiment will be described with reference to FIGS. 1 to 16. In the following description, the left-right direction and the front-back direction in FIG. 1 correspond to an X-axis direction and a Y-axis direction, respectively, and the vertical direction corresponds to a Z-axis direction in FIG. 2. In the following description, the right side and the left side in FIG. 1 correspond to an upstream side and a downstream side, respectively. In the following description, some of the same components are not provided with symbols in the drawings.

(1) Whole Configuration of Surface Mounting Device

As illustrated in FIG. 1, a surface mounting device 1 includes a component mounting device 10 and four tape component supply devices 40. The component mounting device 10 mounts components E such as electronic components on a board P such as a printed circuit board. The tape component supply device 40 supplies the components E included in a component tape 90 (refer FIG. 3) to the component mounting device 10.

(1-1) Component Mounting Device

Figure 10:
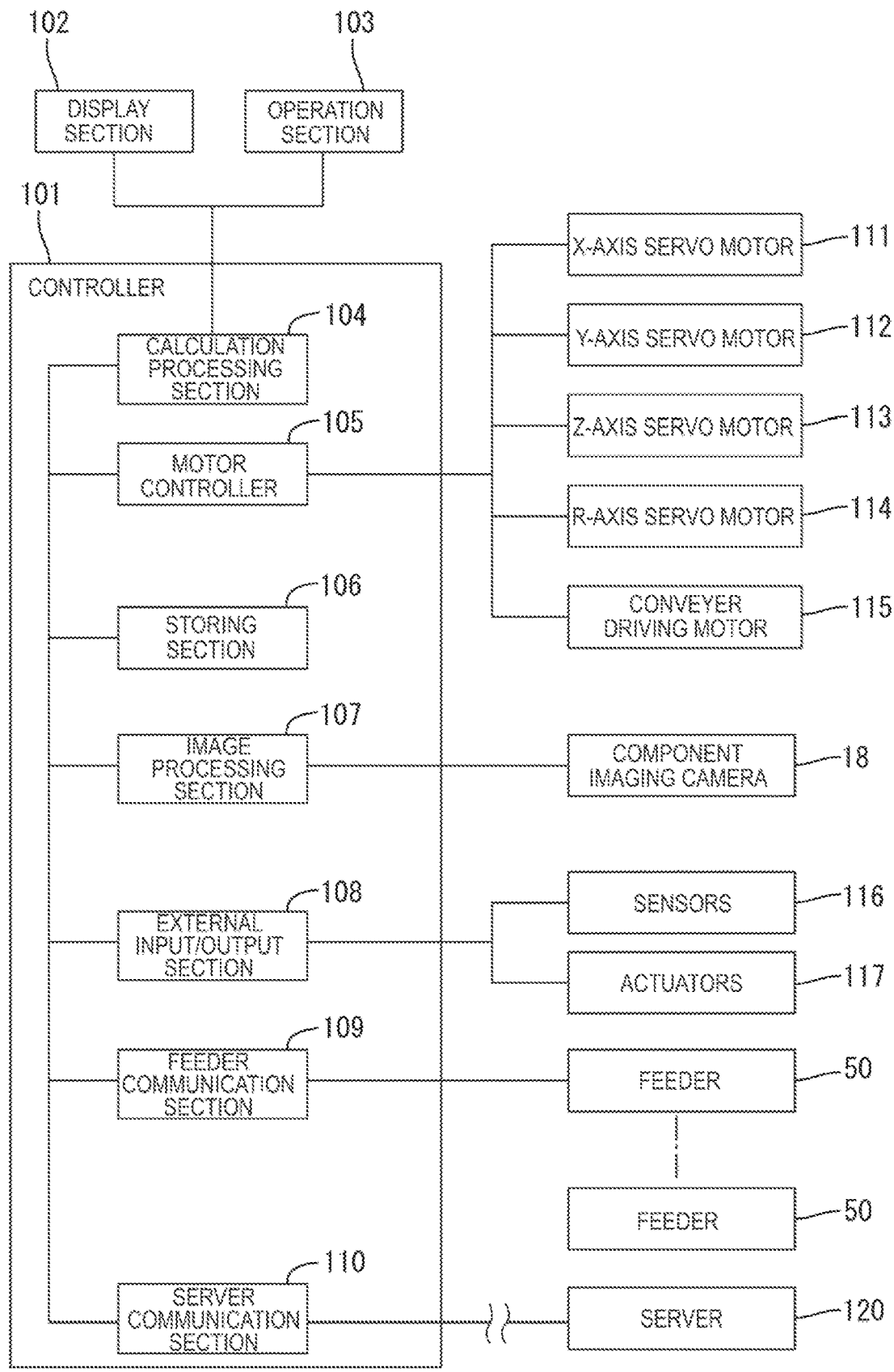
FIG. 10 is a block diagram illustrating an electric configuration of the component mounting device.

The component mounting device 10 includes a base mount 11, a back-up mechanism, which is not illustrated, a transfer conveyer 12, a head unit 13, a head transfer section 15, two component imaging cameras 18, a controller 101, and a display section 102 (one example of an informing section) that are illustrated in FIG. 10. The controller 101 and the display section 102 configure an informing device in the first embodiment.

The base mount 11 has a rectangular plan view shape and a flat upper surface. A quadrangular frame A illustrated with a chain double-dashed line represents a working space for mounting the component E on the board P.

The back-up mechanism, which is not illustrated, is disposed below the working space A. The back-up mechanism fixes and lifts up the board P that has been conveyed by the transfer conveyer 12 to the working space A.

The transfer conveyer 12 is configured to introduce the board P to the working space A from an upstream side with respect to the X-axis direction and discharge the board P on which the components E are mounted in the working space A to a downstream side. The transfer conveyer 12 includes a pair of conveyer belts 12A, 12B and a conveyer driving motor 115 (refer FIG. 10). The conveyer belts 12A, 12B are moved in circulation in the X-axis direction. The conveyer driving motor 115 drives the conveyer belts 12A and 12B. The conveyer belt 12A on the back side is movable in the front-back direction so as to adjust a distance between the two conveyer belts 12A and 12B according to a width of the board P.

The head unit 13 supports mount heads 14 that suction and release the components E. A configuration of the head unit 13 will be described later.

The head transfer section 15 transfers the head unit 13 in the X-axis direction and the Y-axis direction within a certain movable area. The head transfer section 15 includes a beam 16, a pair of Y-axis guide rails 17, an X-axis servo motor 111, and a Y-axis servo motor 112. The beam 16 supports the head unit 13 so as to be movable in the X-axis direction in a reciprocating manner. The Y-axis guide rails 17 support the beam 16 so as to be movable in the Y-axis direction in a reciprocating manner. The X-axis servo motor 111 is configured to move the head unit 13 in the X-axis direction in a reciprocating manner. The Y-axis servo motor 112 is configured to move the beam 16 in the Y-axis direction in a reciprocating manner.

The two component imaging cameras 18 capture images of the components E from a lower side that are suctioned by the mount heads 14. The component imaging camera 18 on the front side is disposed between the two tape component supply devices 40 that are disposed on a front side of the transfer conveyer 12 and are arranged in the X-axis direction. The component imaging camera 18 on the back side is disposed between the two tape component supply devices 40 that are disposed on a back side of the transfer conveyer 12 and are arranged in the X-axis direction.

Figure 2:
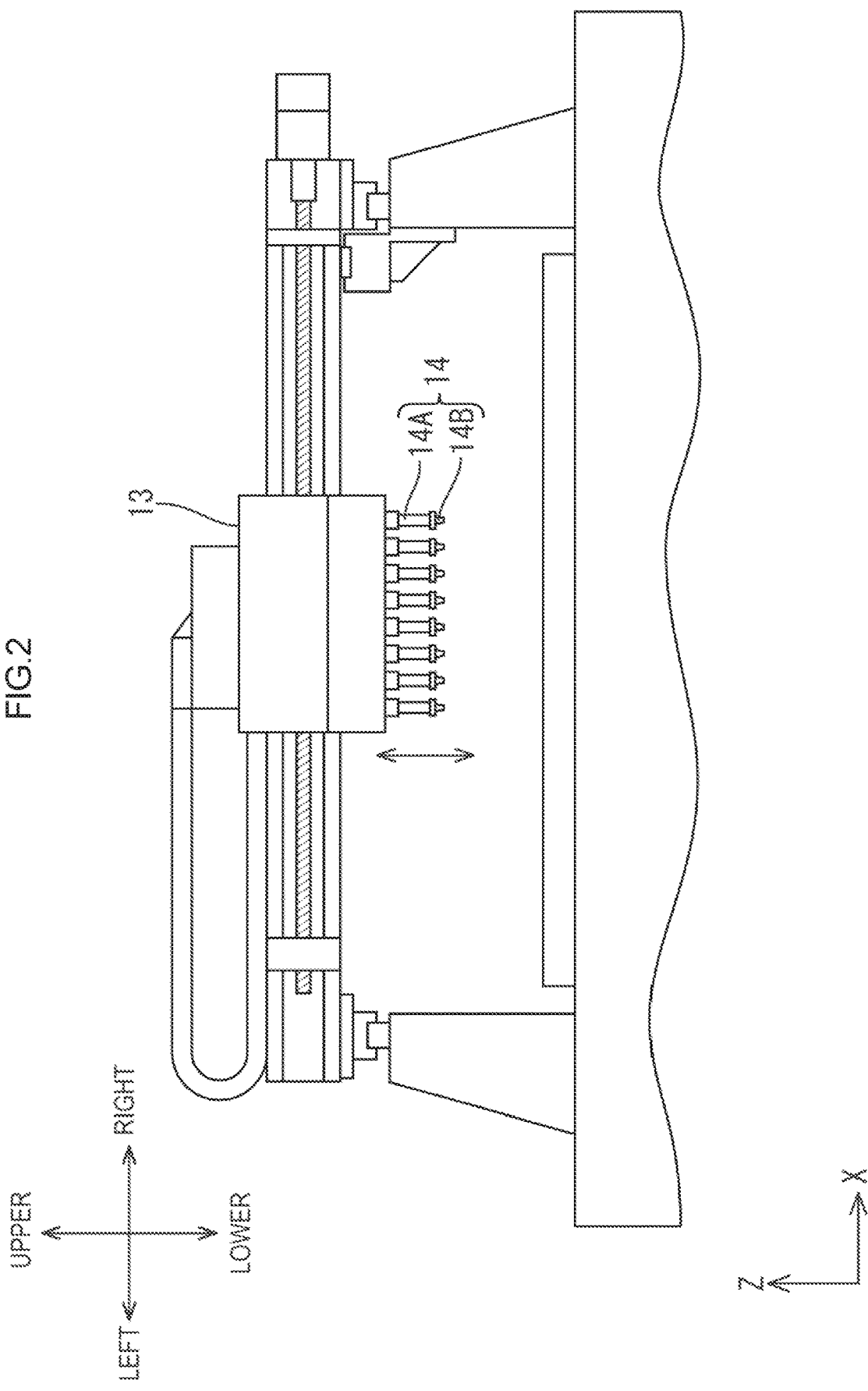
FIG. 2 is a side view of a head unit seen from a front side.

Next, the head unit 13 will be described with reference to FIG. 2. The head unit 13 includes mount heads 14 (eight mount heads 14 in this embodiment), Z-axis servo motors 113 (FIG. 10), and a R-axis servo motor 114 (FIG. 10). Each of the mount heads 14 is supported so as to be moved up and down and rotatable around an axis thereof. Each of the Z-axis servo motors 113 is configured to move up and down each mount head 14 independently. The R-axis servo motor 114 is configured to rotate all of the mount heads 14 around the respective axes at the same time. The head unit 13 in this embodiment is a so-called in-line type head unit and includes the mount heads 14 that are arranged in the X-axis direction. The in-line type head unit 13 is described as one example; however, the head unit 13 may be a so-called rotary head including the mount heads 14 that are arranged on a circumference of the head unit 13.

Each mount head 14 includes a nozzle shaft 14A and a suction nozzle 14B that is attached to a lower edge of the nozzle shaft 14A so as to be detachable. The suction nozzle 14B is supplied with negative pressure and positive pressure from an air supply device, which is not illustrated, via the nozzle shaft 14A. The suction nozzle 14B suctions the component E according to the supply of negative pressure and releases the component E according to the supply of positive pressure.

(1-2) Tape Component Supply Device

Figure 3:
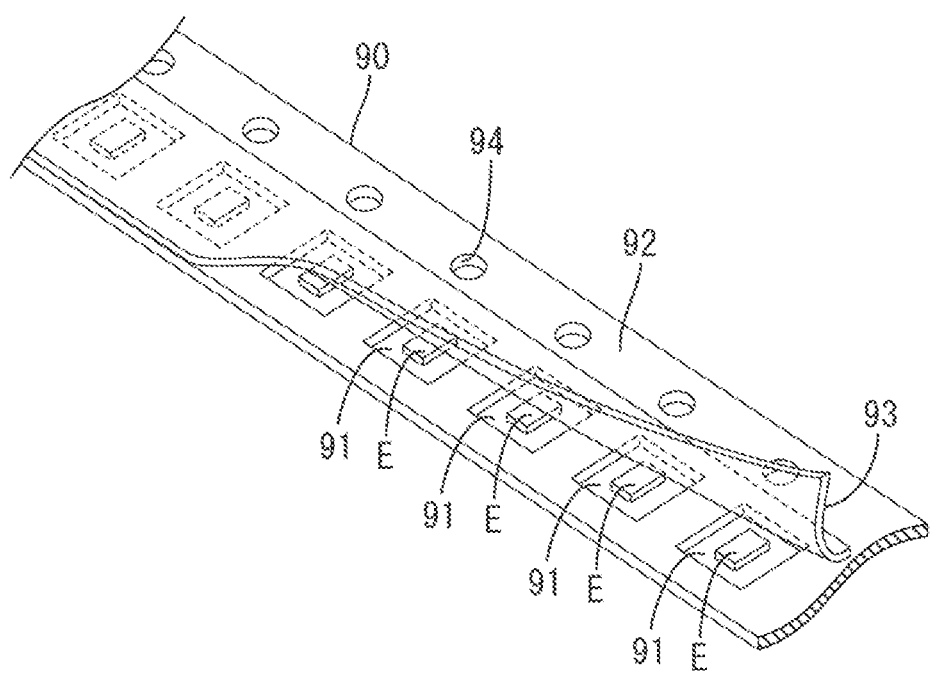
FIG. 3 is a schematic view of a component tape.

First, the component tape 90 will be described with reference to FIG. 3. The component tape 90 includes a carrier tape 92, the components E, and a top tape 93. The carrier tape 92 includes recesses 91 that are arranged at equal intervals in a longitudinal direction thereof. The components E are stored in the respective recesses 91. The top tape 93 is bonded to an upper surface of the carrier tape 92. The component tape 90 includes feeder holes 94 on one edge section thereof. The feeder holes are arranged at equal intervals in the longitudinal direction and teeth of a sprocket included in the tape feeder 50 (refer FIG. 1) are inserted in the respective feeder holes 94. According to rotation of the sprocket, the component tape 90 is conveyed.

Figure 4:
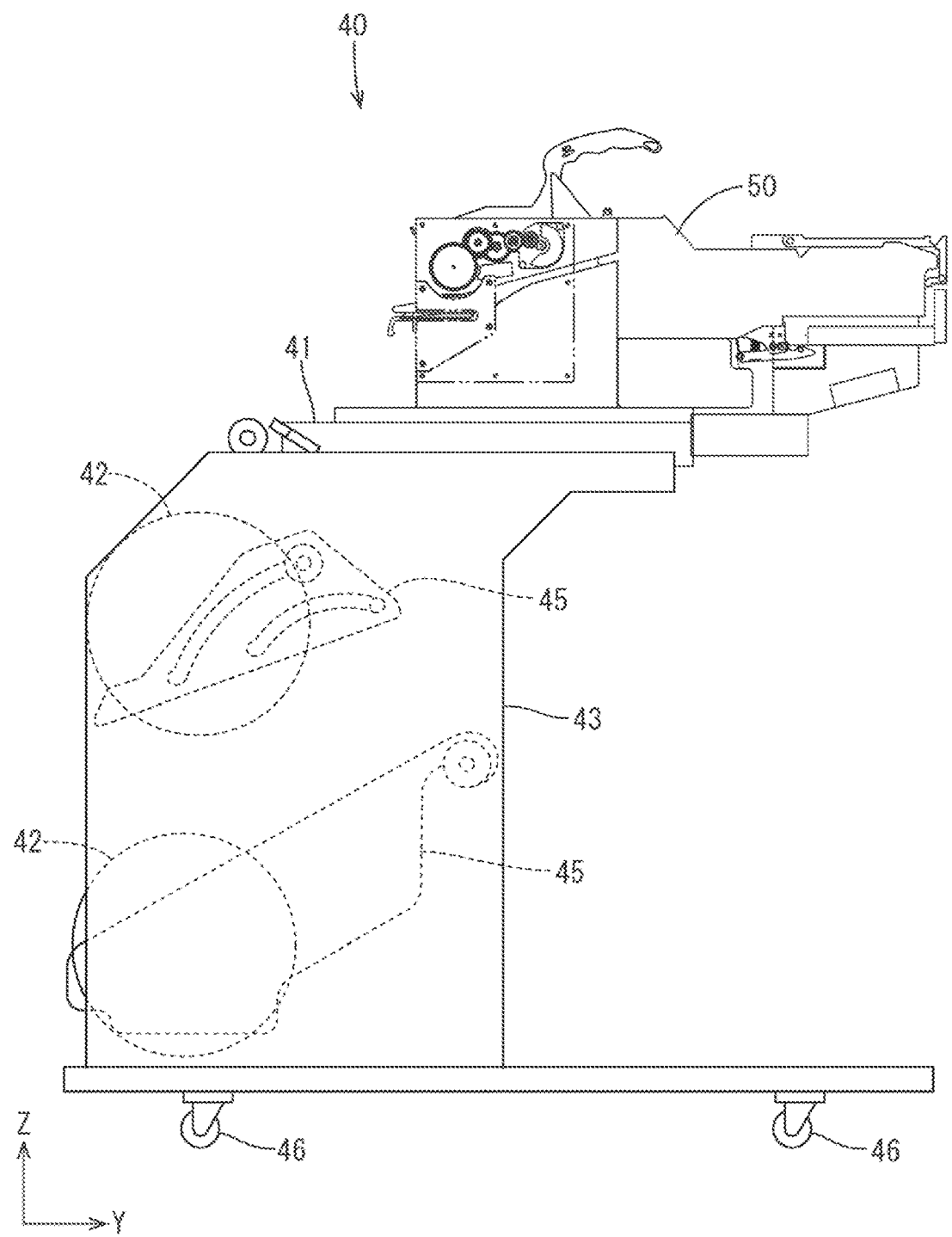
FIG. 4 is a side view of a tape component supply device.

As illustrated in FIG. 1, two tape component supply devices 40 are arranged in the X-axis direction on each of the front side and the back side of the transfer conveyer 12. Four tape component supply devices 40 are arranged in total. As illustrated in FIG. 4, each tape component supply device 40 includes a feeder install section 41 where the tape feeders 50 are installed and a reel support section 43 that supports a tape reel 42 (hereinafter, simply referred to as a reel 42) around which the component tape 90 is wound.

As illustrated in FIG. 1, the tape feeders 50 are installed in the feeder install section 41 to be arranged laterally and aligned with each other.

As illustrated in FIG. 4, the reel support section 43 is disposed on a back lower side with respect to the feeder install section 41. The reel support section 43 includes reel holders 45 and two reel holders 45 are included in every tape feeder 50. The reel holder 45 rotatably supports the reel 42 around which the component tape 90 is wound. One of the two reel holders 45 is disposed on an upper level and another one is disposed on a lower level. Casters 46 that support the tape component supply device 40 to be movable are attached to a lower surface of the reel support section 43.

A reel ID is assigned to each of the reels 42 to uniquely identify each reel 42. A component ID is used to represent a type of the component; however, in this embodiment, different reel IDs are assigned to the reels 42 around which the component tapes 90 including the components having the same component ID are wound. Bar codes (not illustrated) representing the reel IDs are labelled on the surfaces of the reels 42 (for example, side surfaces).

Figure 5:
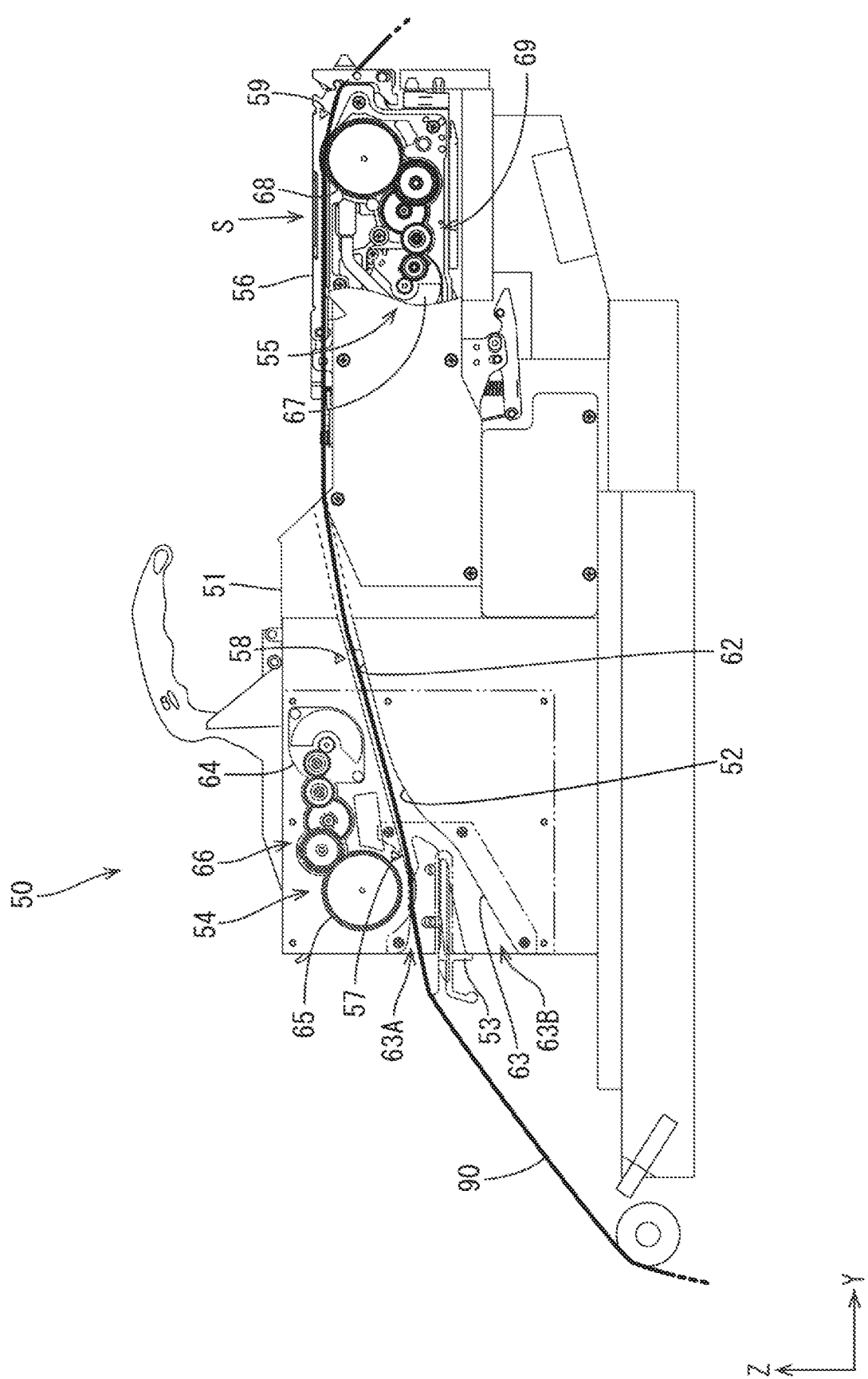
FIG. 5 is a side view of a tape feeder.

As illustrated in FIG. 5, the tape feeder 50 includes a body section 51, and a tape feed path 52, a switching member 53 (one example of a switching section), a loading section 54, a feeding device 55, a tape guide 56, a first tape sensor 57, a second tape sensor 58, a third tape sensor 59, a feeder control section, which is not illustrated, an operation section 71 (refer FIG. 6), and an indicator 61 (refer FIG. 6) that are arranged in the body section 51.

The body section 51 is made of aluminum with die casting and has a long shape elongated in the front-back direction (the Y-axis direction). The position S in FIG. 5 is a component supply position where the component E is supplied to the component mounting device 10. A feeder ID is assigned to the tape feeder 50 for uniquely identifying the tape feeder 50 and a bar code (not illustrated) representing the feeder ID is labelled on the surface of the body section 51 (for example, an upper surface or a back surface).

The tape feed path 52 is a feed path along which the component tape 90 is fed and extends through a back portion of the body section 51 in the front-back direction. The tape feed path 52 includes a narrow and long front-side feed path 62 in a front portion thereof and a back-side feed path 63 in a back portion thereof. The back-side feed path 63 becomes wider in a vertical direction as it extends backwards from a border between the front-side feed path 62 and the back-side feed path 63. The component tape 90 that is inserted into the tape feed path 52 travels out of the tape feed path 52 in a middle portion of the body section 51 with respect to the front-back direction. The component tape 90 is exposed from the body section 51 upward and fed to the component supply position S along the upper surface of the body section 51.

The switching member 53 is attached to the back-side feed path 63 from the back side of the tape feeder 50 so as to be detachable therefrom. The switching member 53 is configured to define the back-side feed path 63 into a first tape feed path 63A and a second tape feed path 63B and also configured to switch the tape feed path for the component tape 90 that is inserted (set) in the first tape feed path 63A and loaded to the second tape feed path 63B. When the switching member 53 is mounted in the back-side feed path 63, the second tape feed path 63B is next to the first tape feed path 63A. A configuration of the switching member 53 and switching of the tape feed path while using the switching member 53 will be described later.

The loading section 54 is included above the first tape feed path 63A to face the first tape feed path 63A. The loading section 54 is configured to automatically feed the component tape 90 whose top end portion is inserted to the first tape feed path 63A to the feeding device 55 (namely, loading). The loading section 54 includes a back-side sprocket 65 and a gear group 66. The back-side sprocket 65 includes teeth that are to be fit in the feeding holes of the component tape 90 that is inserted in the first tape feed path 63A. The gear group 66 is configured to transfer rotation driving power of a back-side motor 64 to the back-side sprocket 65.

The feeding device 55 is installed in a front side portion of the body section 51 and is disposed on a downstream side in the feeding direction of the component tape 90 than the first tape feed path 63A and the second tape feed path 63B.

The feeding device 55 includes a front-side motor 67, a front-side sprocket 68, and a gear group 69. The front-side sprocket 68 includes teeth that are to be engaged with the feeding holes of the component tape 90. The gear group 69 is configured to transfer rotation driving power of the front-side motor 67 to the front-side sprocket 68. The front-side sprocket 68 that is meshed with the loaded component tape 90 is intermittently rotated to stop the component tape 90 such that each of the components E included in the component tape 90 is stopped at the component supply position S sequentially to supply the components E.

The loading is completed when the component tape 90 is fed by the loading section 54 to the feeding device 55 and meshed with the teeth of the front-side sprocket 68 of the feeding device 55.

The tape guide 56 is mounted on a front portion of the upper surface of the body section 51. The tape guide 56 is for guiding the component tape 90 that has travelled through the tape feed path 52 and is exposed upward from the body section 51 to the front-side sprocket 68 and has a narrow long shape in the front-back direction.

An exposing device, which is not illustrated, is disposed inside the tape guide 56 and on a backward side than the component supply position S (in other words, on an upstream side in the tape feed direction than the component supply position S). The exposing device is for removing the top tape 93 to expose the component E. As illustrated in FIG. 3, one edge side portion of the top tape 93 is peeled off by the exposing device and folded toward one side of the carrier tape 92. Accordingly, the components E stored in the recesses 91 are exposed. The exposing device may cut a middle portion of the top tape 93 and opens on both sides to expose the components E.

The first tape sensor 57, the second tape sensor 58, and the third tape sensor 59 are for detecting whether the component tape 90 is present or not. The first tape sensor 57 is disposed to face the first tape feed path 63A of the back-side feed path 63. The second tape sensor 58 is disposed to face the front-side feed path 62. The third tape sensor 59 is disposed on a downstream side in the feeding direction of the component tape 90 than the front-side sprocket 68 of the feeding device 55.

The feeder control section, which is not illustrated, is disposed in a lower section of the tape feeder 50 and configured to control each section of the tape feeder 50 under control by the controller 101 of the component mounting device 10, which will be described later.

Figure 6:
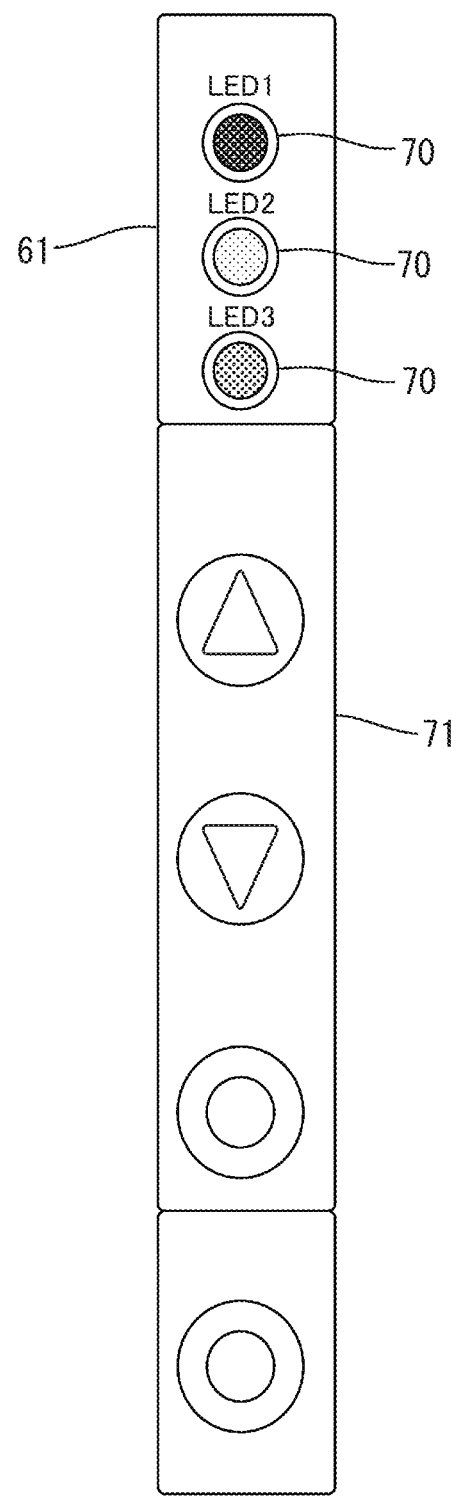
FIG. 6 is a schematic view of an indicator that is mounted on an upper surface of the tape feeder.

As illustrated in FIG. 6, the operation section 71 is included on the back-side upper surface of the body section 51. The operation section 71 includes a loading button and a discharge button. An operator operates the operation section 71 to manually instruct the device to load or discharge the component tape 90.

The indicator 61 includes three LEDS 70 (one example of a light emitting section) of green, yellow, and red. The LEDs 70 are for informing the number of remaining components E in the component tape 90 that is loaded and supplying the components E to the component mounting device 10 by the color of the LED 70. If the number of remaining components E is sufficiently large, the green LED 70 is lighted on. If the number of remaining components E is getting smaller, the yellow LED 70 is lighted on. If the number of remaining components E is quite small, the red LED 70 is lighted on.

The color of red represents a warning indicating that the remaining number is very small. If the remaining number is very small, the controller 101 of the component mounting device 10, which will be described later, lights on the red LED 70 and makes a predefined warning noise to warn the operator. In this embodiment, the waring noise is referred to as an operator call.

Although details will be described later, the indicator 61 is used for displaying that a subsequent component tape 90 can be preset in the first tape feed path 63A.

Figure 7:
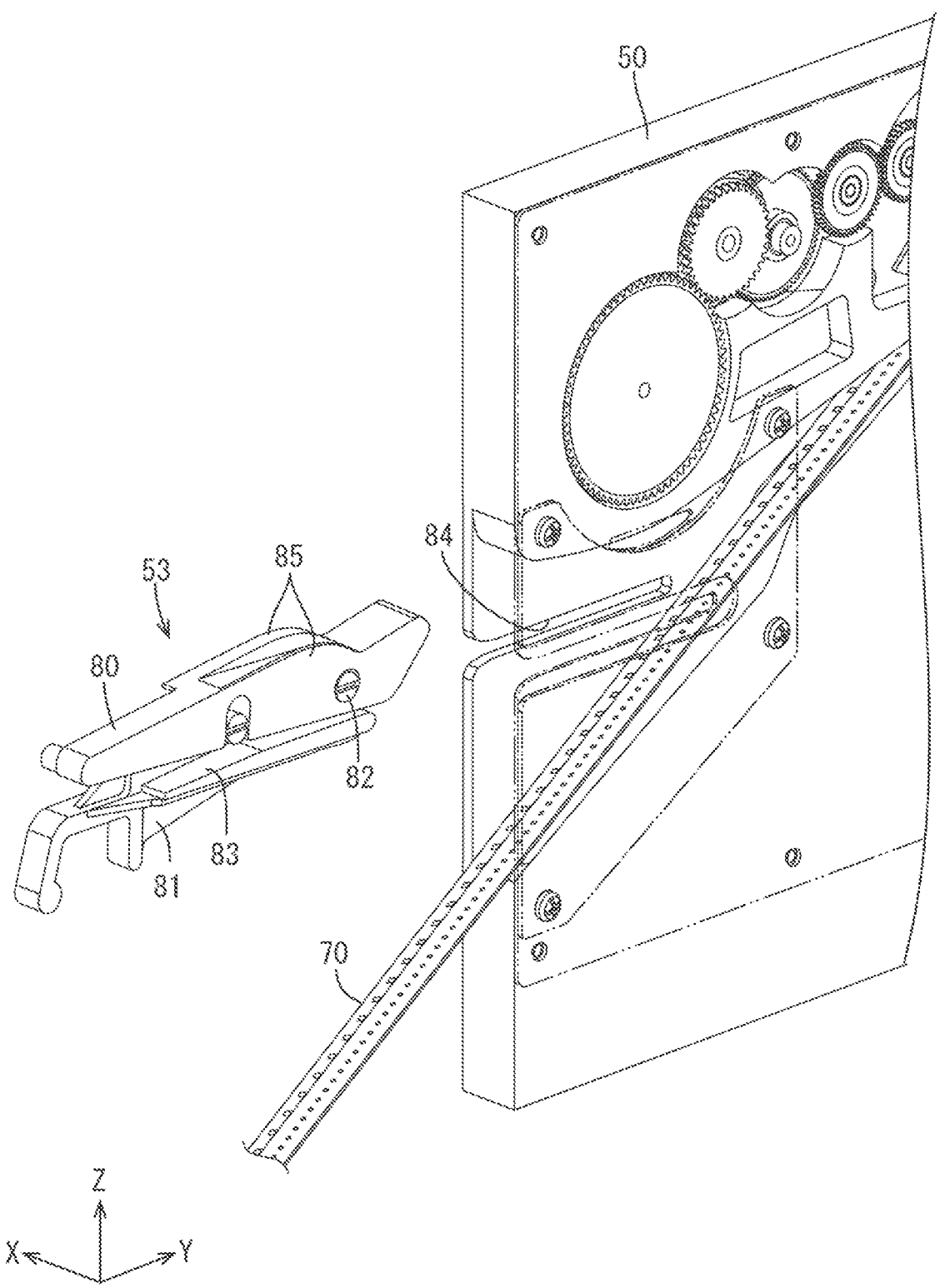
FIG. 7 is a perspective view of the tape feeder seen from a back side (a switching member is detached)

(1-3) Configuration of Switching Member and Switching of Tape Feed Path Using Switching Member As illustrated in FIG. 7, the switching member 53 includes an upper member 80 and a lower member 81. The upper member 80 and the lower member 81 are joined each other at one ends thereof (the right side portions in FIG. 7) with a connecting screw 82. A coil spring, which is not illustrated, is wound around a shaft of the connecting screw 82. Therefore, when the switching member 53 is detached from the body section 51, another ends of the upper member 80 and the lower member 81 are slightly away from each other due to an elastic force of the coil spring.

The lower member 81 of the switching member 53 includes flange portions 83 that extend from two side surfaces thereof with respect to a width direction of the component tape 90 to be fed, respectively. The body section 51 includes slits 84 on two side surfaces of the back-side feed path 63 so as to open backward thereof. The slits 84 are formed in a thin and long shape extending in the front-back direction. The switching member 53 is attached to the body section 51 while the portion thereof including the connecting screw 82 being as a front side. The flange portions 83 of the lower member 81 are supported by the slits 84.

The upper member 80 includes contact walls 85 that extend upward slightly from the respective edges of the upper surface thereof with respect to the width direction. The contact walls 85 have a space therebetween and the space is larger than the width dimension of the component tape 90. A part of the teeth of the back-side sprocket 65 of the loading section 54 is put in the space between the contact walls 85 when the switching member 53 is attached to the body section 51.

When the switching member 53 is attached to the body section 51, the contact walls 85 receive an upward force due to an elastic restoring force of the coil spring. Accordingly, the switching member 53 is held in the back-side feed path 63. This suppresses the switching member 53 from being detached from the body section 51.

Figure 8:
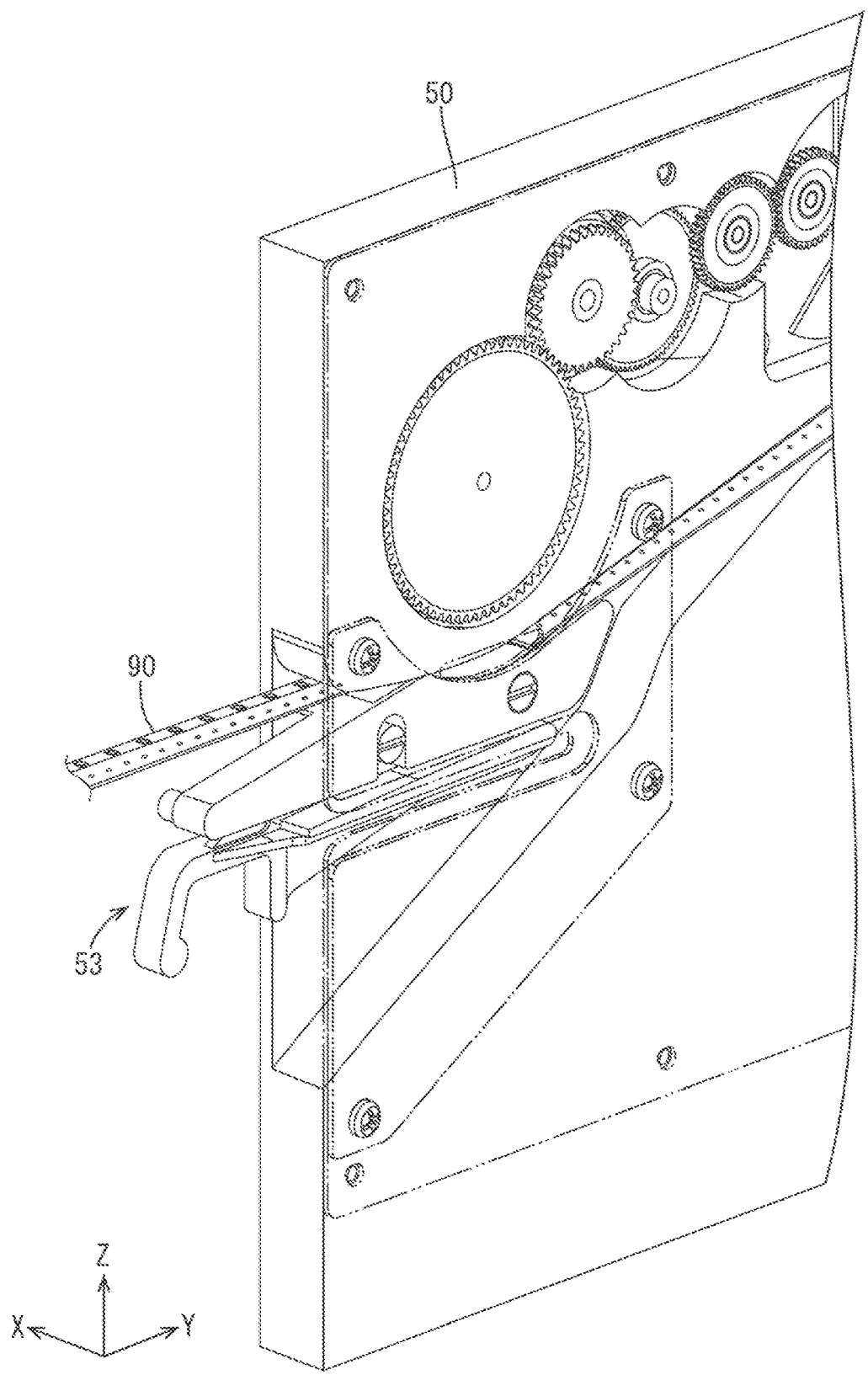
FIG. 8 is a perspective view of the tape feeder seen from the back side (a component tape is inserted in a first tape feed path and loaded)

FIG. 8 illustrates the component tape 90 that is inserted into the first tape feed path 63A and fed by the loading section 54 and reaches the feeding device 55 and is meshed with the front-side sprocket 68 of the feeding device 55 (the state illustrated in FIG. 5). Since the component tape 90 is meshed with the front-side sprocket 868, the component tape 90 can continue to be fed even after the tape feed path for the subsequent component tape 90 that is inserted (set) in the first tape feed path 63A and loaded is switched to the second tape feed path 63B.

Figure 9:
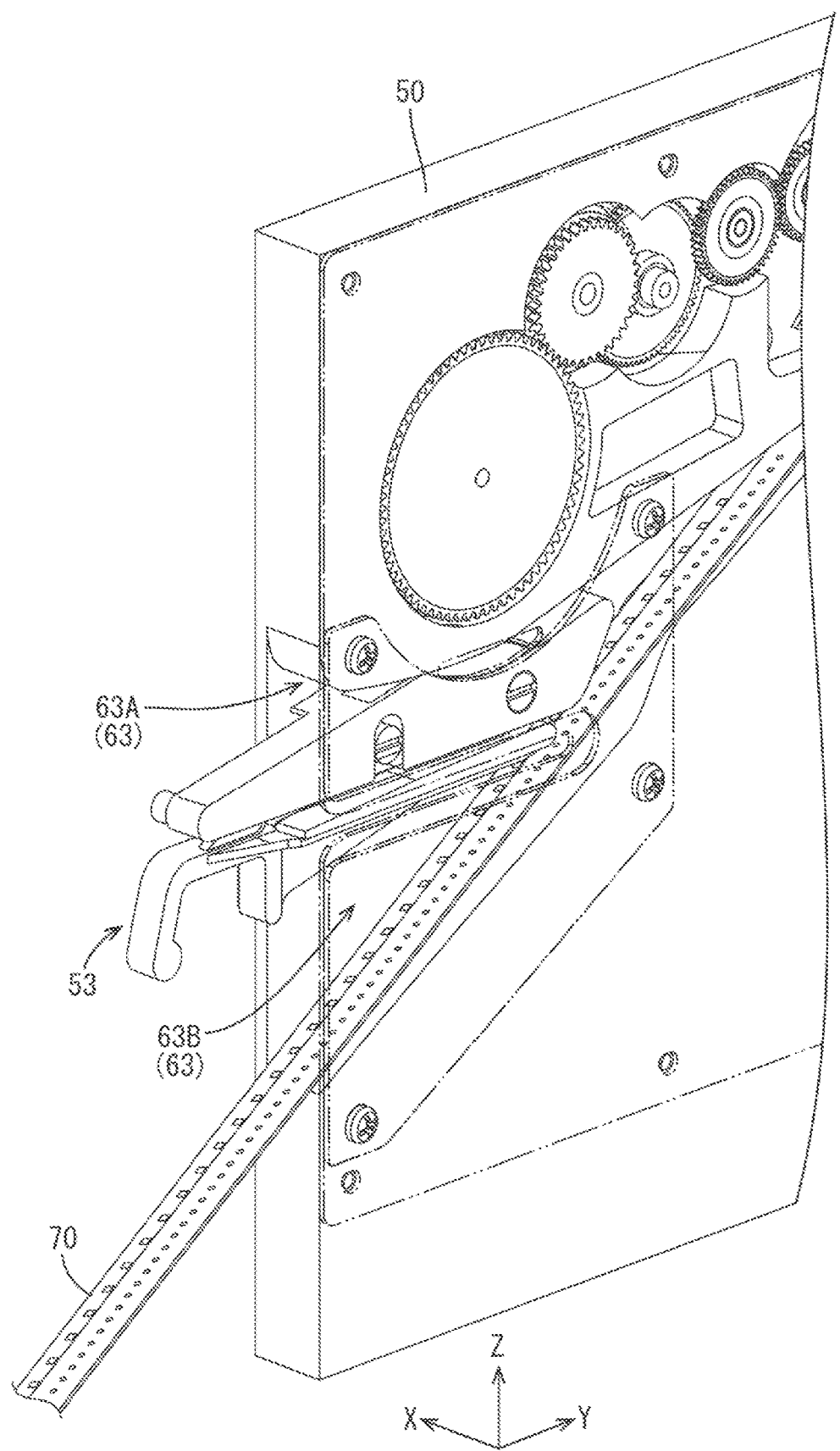
FIG. 9 is a perspective view of the tape feeder seen from the back side (the tape feed path is switched from the first tape feed path to a second tape feed path)

If the operator detaches the switching member 53 in this state, the component tape 90 drops because of its own weight as illustrated in FIG. 7. If the operator attaches the switching member 53 in this state, the back-side feed path 63 is divided into the first tape feed path 63A and the second tape feed path 63B by the switching member 53 again as illustrated in FIG. 9. The tape feed path for the component tape 90 is switched from the first tape feed path 63A to the second tape feed path 63B.

(2) Electric Configuration of Component Mounting Device

As illustrated in FIG. 10, the component mounting device 10 includes the controller 101, the display section 102, and an operation section 103. The controller 101 includes a calculation processing section 104, a motor controller 105, a storing section 106, an image processing section 107, an external input/output section 108, a feeder communication section 109, and a server communication section 110.

The calculation processing section 104 includes a CPU, a ROM, and RAM and is configured to execute a control program stored in the ROM to control each of the sections of the surface mounting device 1. The calculation processing section 104 may include an application specific integrated circuit (ASIC) or a field programmable gate array (FPGA) instead of or in addition to the CPU.

The motor controller 105 is configured to rotate each of the X-axis servo motor 111, the Y-axis servo motor 112, the Z-axis servo motor 113, the R-axis servo motor 114, and the conveyer driving motor 115 under the control of the calculation processing section 104.

The storing section 106 stores various kinds of data. Various kinds of data includes information on the produced number of boards P or the type of boards P that are to be produced, information on the mounting coordinate or the mounting angle of the components E, and information on the mounting order of the components E.

The image processing section 107 is configured to receive image signals that are output by the component imaging camera 18 and generate digital images based on the output image signals.

The external input/output section 108 is a so-called interface and is configured to receive detection signals that are output by various kinds of sensors 116 that are included in a body section of the component mounting device 10. The external input/output section 108 is configured to control operations on various kinds of actuators 117 based on the control signals that are output by the calculation processing section 104.

The feeder communication section 109 is connected to a feeder controller of each tape feeder 50. The controller 101 controls the tape feeders 50 via the feeder communication section 109. The controller 101 receives detection signals detected by the tape sensor of each tape feeder 50 via the feeder communication section 109.

The server communication section 110 is for communicating with a server computer 120 (hereinafter, simply referred to as a server 120) that manages information on each of the tape feeders 50 that are installed in the tape component supply device 40. The server communication section 110 is connected to the server 120 via a transmission network such as a local area network (LAN) so as to establish communication.

The display section 102 includes a display device such as a liquid crystal display and a driving circuit that drives the display device. Although details will be described later, the display section 102 displays (one example of informing) that presetting is possible when a subsequent component tape 90 can be preset in the first tape feed path 63A.

The operation section 103 includes an input device such as a touch panel, a keyboard, and a mouse. An operator can perform various setting by operating the operation section 103.

(3) Management Table for Tape Feeder

Figure 11A:
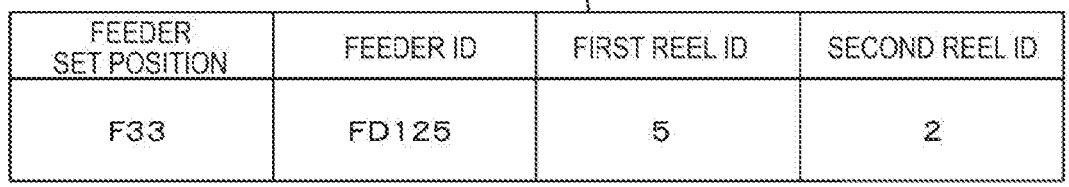
FIGS. 11A-11C are management tables.

Next, the management table 130 (one example of management information) that is stored in the server 120 will be described with reference to FIGS. 11A-11C. The management table 130 is a table for collectively managing information on each of the tape feeders 50 that are installed in the tape component supply device 40. As illustrated in FIG. 11A, the management table 130 includes a feeder set position box, a feeder ID box, a first reel ID box, and a second reel ID box. The management table 130 includes other boxes which are not described.

The feeder set position box previously stores the position in the feeder install section 41 of the tape component supply device 40 where the tape feeder 50 is installed. The feeder ID box previously stores the feeder ID of the tape feeder 50 that is installed in the feeder install section 41 of the tape component supply device 40.

Specifically, each of the tape feeders 50 is electrically connected to the component mounting device 10 so as to transmit corresponding to the feeder set position. Therefore, the controller 101 can obtain the feeder ID and the feeder set position of each tape feeder 50. The feeder ID and the feeder set position that are obtained by the controller 101 are transmitted from the controller 101 to the server 120 and the feeder ID and the feeder set position that are associated with each other are registered in the management table 130.

When only one component tape 90 is present in the tape feeder 50, the reel ID of the reel around which the one component tape 90 is wound is registered in the first reel ID box. When two component tapes 90 (namely, a preceding component tape 90 and a subsequent component tape 90) are present in the tape feeder 50, the reel ID of the component tape 90 that is present in the second tape feed path is registered in the second reel ID box.

The reel ID is registered in the first reel ID box when a component tape 90 is detected by the first tape sensor 57 after the reel ID is read by a barcode reader, which will be described later. The reel ID that is registered in the first reel ID box is deleted when the reel ID is registered in the first reel ID box and no reel ID is registered in the second reel ID box and the component tape 90 is discharged in response to determination that the component tape 90 has no component. When the reel IDs are registered in both of the first reel ID box and the second reel ID box, respectively, the reel ID that is registered in the second reel ID box is deleted in response to determination that the component tape 90 has no component.

FIG. 12 illustrates the tape feeder 50 before starting the mounting of the components E on the board P (hereinafter, referred to as production). In FIG. 12, an operator sets a first component tape 90 in the first tape feed path 63A to start producing the board P.

An operator reads the reel ID of the tape reel 42 around which the component tape 90 to be set with using a portable type barcode reader (not illustrated) that is connected to the server 120 so as to establish communication before setting the component tape 90 in the tape feeder 50. Then, the operator sets a top end portion of the component tape 90 in the first tape feed path 63A of the tape feeder. When the top end portion of the component tape 90 is set in the first tape feed path 63A, the component tape 90 is detected by the first tape sensor 57 and the read reel ID is registered in the first reel ID box of at the corresponding feeder set position. In other words, the reel ID is registered when a new component tape 90 is inserted in the first tape feed path 63A and detected by the first tape sensor 57.

The tape feeder 50 may include a feeder instruction LED that is different from the indicator 61 described earlier. The feeder instruction LED of the tape feeder 50 in which the component tape 90 is to be set may be lighted on. According to such a configuration, the operator can easily know the tape feeder 50 in which the component tape 90 is to be set.

The reel ID may be read after the component tape 90 is set (or preset) in the first tape feed path.

Figure 11B:
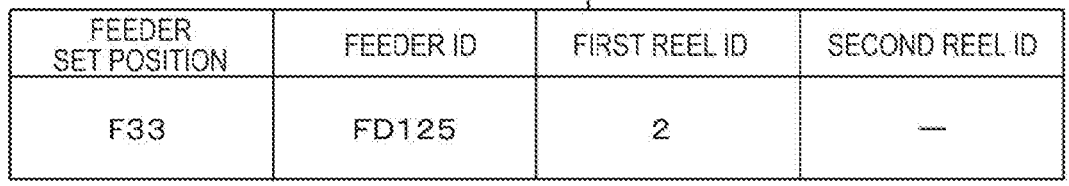

As illustrated in FIG. 11B, the feeder ID and the reel ID that have been read are transmitted to the server 120 and the transmitted reel ID is registered in the first reel ID box of the management table 130 that is included in the same row having the feeder ID that matches the transmitted feeder ID. If the reel ID of another component tape 90 is read while the reel ID being registered in the first reel ID box and the component tape 90 is detected by the first tape sensor 57, as illustrated in FIG. 11A, the reel ID registered in the first reel ID box is moved up to the second reel ID box and the reel ID of the other component tape 90 is registered in the first reel ID box.

In other words, the reel ID is registered in the second reel ID box when the reel ID is registered in the first reel ID box and the subsequent component tape 90 is preset. The reel ID that has been registered in the first reel box is shifted to the second reel ID box.

In this embodiment, the first tape sensor 57 is disposed on a downstream side of the back-side sprocket 65 and the component tape 90 is detected by the first tape sensor 57 at a position where the set (or preset) component tape 90 is meshed with the back-side sprocket 65 and further fed. However, the first tape sensor 57 may be disposed on an upstream side of the back-side sprocket 65 as long as the component tape 90 is meshed with the sprocket 65.

When the reels 42 are installed in the respective tape feeders 50, the above-described series of reading and registering operations are performed for every set of the tape feeder 50 and the reel 42. Namely, if the feeder IDs or the reel IDs are read successively, an alarm is output and the reading cannot be accepted.

Figure 11C:
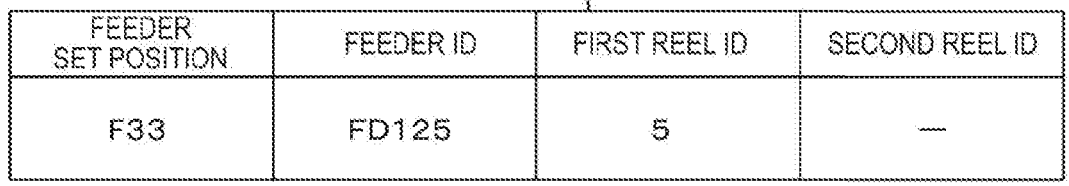

If the tape feed path is switched to the second tape feed path 63B and the component tape 90 is discharged with no component, the reel ID is deleted from the second reel ID box as illustrated in FIG. 11C.

If the tape path for the loaded component tape 90 is not switched to the second tape feed path 63B, the reel ID is registered only in the first reel ID box. Furthermore, even if the tape path is switched, a subsequent component tape 90 may not be preset. In such a case, the state is maintained and the component tape 90 (a loaded component tape 90) supplies the components and if the component tape 90 has no component any more, the component tape 90 is discharged. The reel ID is deleted from the first reel ID box and no reel ID is registered in any of the reel ID boxes.

If the component tape 90 is present in each of the first tape feed path 63A and the second tape feed path 63B (namely, if the two component tapes 90 are present in the tape feeder 50) and the preset component tape 90 that is preset in the first tape feed path 63A is pulled out due to some reasons, the component tape 90 is not detected by the first tape sensor 57 and the reel ID registered in the first reel ID box is deleted.

In such a state, the reel ID registered in the second reel ID box is moved down to the first reel ID box. Namely, the reel ID registered in the first reel ID box is not necessarily the reel ID of the reel around which the component tape 90 preset in the first tape feed path 63A is wound but may be the reel ID of the reel around which the component tape 90 that is present in the second tape feed path 63B.

The management table 130 is stored not only in the server 120 but the same data related to the component mounting device 10 may be stored in the storing section 106 of the controller 101.

Only for determining whether the presetting is possible or not, the presence of the component tape 90 may be registered in the first reel ID box and the second reel ID box of the management table 130 instead of the reel IDs.

(4) Displaying that Presetting is Possible

In this embodiment, the following operation is referred to as setting of the component tape 90. In an initial state having no component tape 90, the component tape 90 is inserted in the first tape feed path 63A and is meshed with the teeth of the back-side sprocket 65 and supported by the switching member 53 to maintain the engagement state.

In the present embodiment, the following operation is referred to as presetting. When the previously set component tape 90 is loaded to be able to supply the components E, the subsequent component tape 90 is set in the first tape feed path. Namely, presetting is a special case of setting.

The controller 101 determines whether the subsequent component tape 90 can be preset in the first tape feed path 63A based on the management table 130 and the detection result of each of the tape sensors. If it is determined that the presetting is possible, the controller 101 keeps displaying on the display section 102 that the presetting is possible until the subsequent component tape 90 is preset in the first tape feed path 63A. It is determined that the presetting is possible, when the reel ID is registered in the first reel ID box and no reel ID is registered in the second reel ID box.

It is determined that the component tape is preset, when the reel ID is registered in the first reel ID box and no reel ID is registered in the second reel ID box as illustrated in FIG. 11C and the component tape is detected by the first tape sensor 57.

It is determined whether presetting is possible not based on the detection results of the first to third tape sensors but based on the management table 130 because it cannot be determined appropriately whether presetting is possible only based on combinations of the detection results of ON (the component tape 90 is present) and OFF (the component tape 90 is not present). Hereinafter, details will be described.

Figure 13:
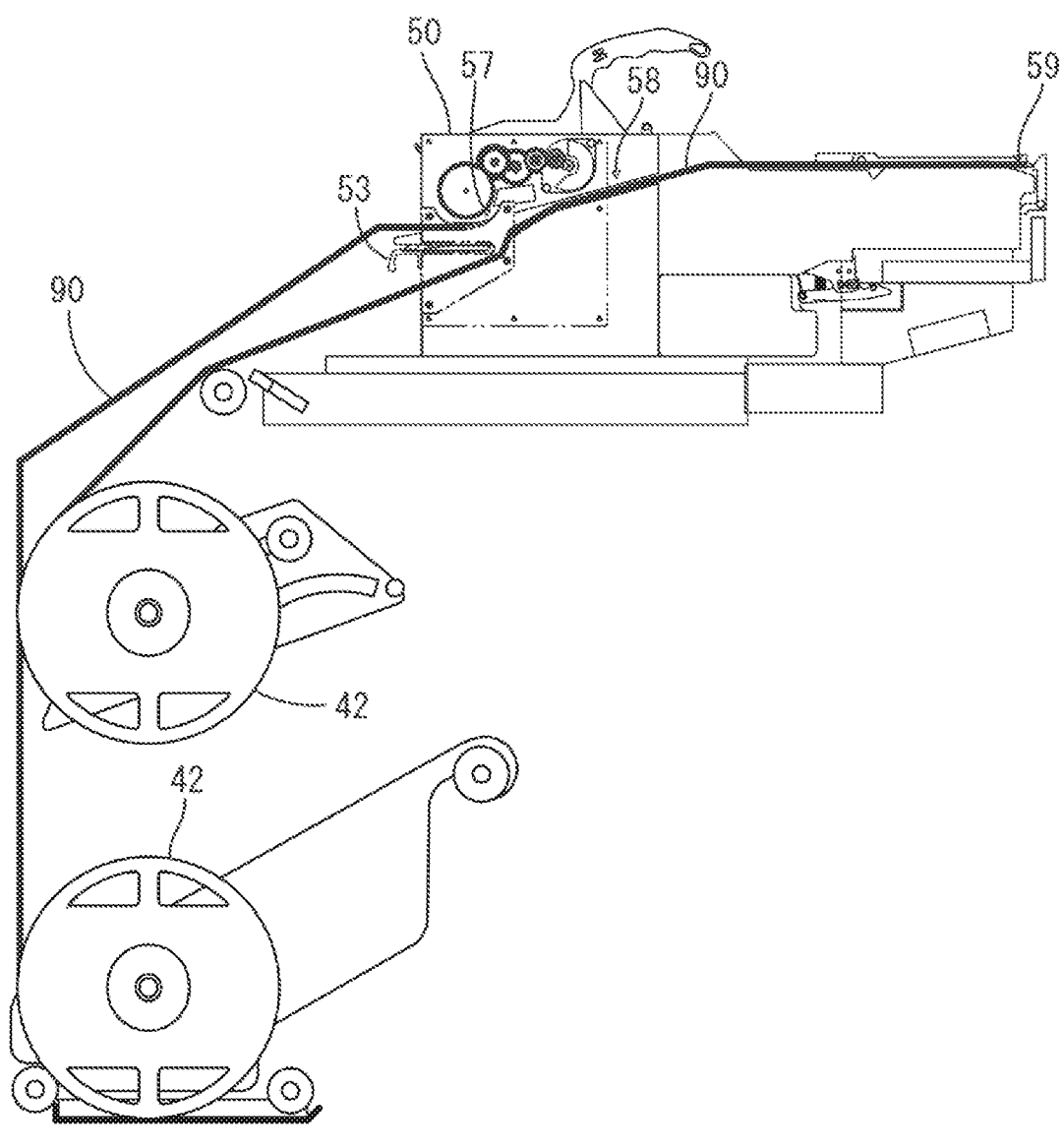
FIG. 13 is a schematic view of a tape component supply device.

The component tape 90 is detected by the first to third tape sensors at the same time when the same component tape 90 is detected by the three tape sensors as illustrated in FIG. 5 and when the first tape sensor 57 detects the component tape 90 that is inserted in the first tape feed path 63A and the second and third tape sensors detect another component tape 90 that is inserted in the second tape feed path 63B as illustrated in FIG. 13.

In the state illustrated in FIG. 5, if the tape feed path for the component tape 90 that is inserted in the first tape feed path 63A is switched to the second tape feed path 63B, the first tape feed path 63A becomes free and the subsequent component tape 90 can be preset in the first tape feed path 63A. On the other hand, in the state illustrated in FIG. 13, the component tape 90 is present in each of the first tape feed path 63A and the second tape feed path 63B. Therefore, another component tape 90 cannot be preset. Thus, it cannot be determined correctly whether presetting is possible or not only by the first to third tape sensors. The first to third tape sensors are used in an auxiliary manner for displaying that presetting is possible or not.

Next, the processes that are performed when the subsequent component tape 90 can be preset in the first tape feed path 63A will be specifically described. In the following two cases, presetting is possible in this embodiment.

(Case A)

When no component tape 90 is in the first tape feed path 63A and the second tape feed path 63B, the component tape 90 is set in the first tape feed path 63A and loaded.

When no component tape 90 is in the first tape feed path 63A and the second tape feed path 63B and the component tape 90 is set in the first tape feed path 63A, the component tape 90 is loaded. The loading of the component tape 90 is started when the component tape 90 is set in the first tape feed path 63A and the operation section 71 of the tape feeder 50 is operated or when the operation start button of the surface mounting device 1 is pressed after set-up changes.

After the loading is completed, the operator switches the tape feed path for the loaded component tape 90 to the second tape feed path 63B and this allows the subsequent component tape 90 to be preset in the first tape feed path 63A.

If the loading is not completed, the tape feed path can be switched as long as the component tape 90 is meshed with the front-side sprocket 68 and therefore, presetting is possible. It cannot be determined whether the component tape 90 is meshed with the front-side sprocket 68 until the component tape 90 is detected by the third tape sensor 59. Therefore, if the third tape sensor 59 detects the component tape 90, the display indicating that presetting is possible is allowed.

Namely, after the component tape 90 is inserted in the tape feed path 63A and the first reel ID is registered as illustrated in FIG. 11B, the loading is started. Then, if the component tape 90 is detected by the third tape sensor 59, the display indicating that presetting is possible is allowed. The loading is completed when the component tape 90 stops to allow the component E to be sucked. Therefore, it is preferable to display that presetting is possible after the component tape 90 stops and the loading is completed.

In the present embodiment, the feeding device 55 includes only one front-side sprocket 68. The feeding device 55 may include at least two sprockets arranged along the tape feed path. After the component tape 90 is meshed with one sprocket, a subsequently fed component tape 90 may be meshed with another one sprocket. In such a configuration, if the tape is meshed with the first sprocket, the switching of the tape feed path can be performed. In such a configuration, the exposing device for removing the cover tape from the component tape 90 to expose the component E is preferably disposed between the two sprockets and the tape sensor detecting the component tape 90 may be disposed between the first sprocket and the exposing device within the feeding device 55. If the component tape 90 is detected by the tape sensor, the display indicating that presetting is possible is allowed.

(Case B)

If the component tape 90 that is in the second tape feed path 63B has no components, the component tape 90 is discharged and the component tape 90 that is preset in the first tape feed path 63A is loaded.

If the component tape 90 that is in the second tape feed path 63B has no components, the component tape 90 is discharged and the component tape 90 that is preset in the first tape feed path 63A is automatically loaded. If the loading is completed, the operator switches the tape feed path for the loaded component tape 90 to the second tape feed path 63B such that the subsequent component tape 90 can be preset in the first tape feed path 63A. Other processes in the case B are similar to those in the case A.

Next, the flow of displaying that presetting is possible with using the management table 130 will be described more specifically.

As described earlier, FIG. 12 illustrates a state in which the operator sets the first component tape 90 in the first tape feed path 63A. In this case, as illustrated in FIG. 11B, the reel ID is registered in the first reel ID box. Therefore, the management table is changed from the state in which no reel ID is registered in each of the first reel ID box and the second reel ID box to the state in which the reel ID is registered only in the first reel ID box.

When the management table is changed to the state in which the reel ID is registered in only the first reel ID box, the controller 101 controls the loading section 54 to feed the component tape 90 that is preset in the first tape feed path 63A to the feeding device 55 (namely, loading the component tape 90).

As described earlier, the loading of the component tape 90 is started when the component tape 90 is set in the tape feed path 63A and the operation section 71 of the tape feeder 50 is operated or when the operation start button of the surface mounting device 1 is pressed after the set-up changes.

If the component tape 90 is detected by the third tape sensor 59, the controller 101 supposes that the loading is completed (in other words, the component tape 90 reaches the feeding device 55) and stops the loading section 54. Accordingly, the loading of the component tape 90 that is set in the first tape feed path 63A is completed (namely, the above-described case A is established).

If the component tape 90 is set (or preset) in the first tape feed path 63A and the component tape 90 is pulled out before starting the loading, the first tape sensor 57 does not detect the component tape 90. Such information is transmitted from the controller 101 of the component mounting device 10 to the server 120 and the reel ID is deleted from the first reel ID box. Therefore, the loading is not performed. If the controller 101 detects that the component tape 90 is not detected by the first tape sensor 57, the loading may not be performed (namely, the controller may not rotate the motor 64).

After completing the loading, the controller 101 keeps displaying on the display section 102 that the subsequent component tape 90 can be preset in the first tape feed path 63A until the subsequent component tape 90 is preset in the first tape feed path 63A. Specific displaying manners will be described later.

Namely, if the management table 130 is shifted to the state in which the reel ID is registered only in the first reel ID box (the state illustrated in FIG. 11B), the loading is started. If the component tape 90 is meshed with the front-side sprocket 68 and detected by the third tape sensor 59, it is supposed that the loading is completed and the display indicating that presetting is possible is started.

The operator looks at the display section 102 and notices that presetting is possible and switches the tape feed path for the component tape 90 that is inserted in the first tape feed path 63A to the second tape feed path 63B as illustrated in FIG. 13 and presets the subsequent component tape 90 in the first tape feed path 63A. After reading the feeder ID and the reel ID with the barcode scanner, the operator presets the subsequent component tape 90 in the first tape feed path.

If the first tape sensor 57 detects the preset component tape 90, the reel ID that is registered in the first reel ID box is moved up to the second reel ID box and the reel ID of the preset component tape 90 is registered in the first reel ID box as illustrated in FIG. 11A. Namely, the management table 130 is shifted from the state in which a reel ID is registered only in the first reel ID box to the state in which reel IDs are registered in both of the first reel ID box and the second reel ID box, respectively. If the management table 130 is shifted to this state, the controller 101 determines that the subsequent component tape 90 is preset in the first tape feed path 63A and cancels the display indicating that presetting is possible.

The tape feed path for the component tape 90 is switched to the second tape feed path 63B by the operator and such a component tape 90 is fed by the feeding device 55 sequentially and the components E are supplied to the component mounting device 10. If the second tape sensor 58 does not detect the component tape 90 and the mount head 14 fails to suction the component E a certain number of times or more (for example, three times) successively, the controller 101 determines the component tape has no component thereon.

The method of determining whether the components E run out or not is not limited to the above described one but may be another one. For example, the number of components E that have been suctioned from one component tape 90 is counted and when the counted number reaches the number of components E included in the component tape 90, it may be determined that the components run out. Or when the whole component tape 90 has been fed and the third tape sensor 59 detects no tape, it may be determined that the components run out.

If determining that the component tape has no component, the controller 101 rotates the feeding device 55 and discharges the component tape 90 to the front side. As illustrated in FIG. 11C, the reel ID of the discharged component tape 90 is deleted from the second reel ID box of the management table 130. Accordingly, the management table 130 is shifted from the state in which a reel ID is registered in each of the first reel ID box and the second reel ID box to the state in which a reel ID is registered only in the first reel ID box.

The component tape 90 that is a target to be discharged may be completely discharged when the subsequent component tape 90 is loaded and pushes out the component tape 90 that is a target to be discharged. In such a case, since the subsequent component tape 90 pushes out the component tape 90 that is a target to be discharged, a border between the two tapes may not be found. Therefore, when the front-side sprocket 68 starts to rotate continuously for discharging the component tape 90 that is a target to be discharged, it may be supposed that the component tape 90 that is a target to be discharged is discharged and the reel ID may be deleted. Or when predetermined time is passed after the front-side sprocket 68 has started to rotate continuously, it may be supposed that the component tape 90 to be discharged is discharged and the reel ID may be deleted.

If the management table is shifted to the state in which a reel ID is registered only in the first reel ID box, the controller 101 performs loading of the component tape 90 that is preset in the first tape feed path 63A (namely, the case B described earlier is established). If the loading is completed, the controller 101 displays on the display section 102 that the subsequent component tape 90 can be preset in the first tape feed path 63A. Subsequent operations are similar and will not be described.

If the operator does not preset the subsequent component tape 90 after the loading of the component tape 90 that is set in the first tape feed path 63A, the loaded component tape 90 is fed sequentially while being inserted in the first tape feed path 63A and the components are supplied. If the component tape 90 has no component any more, the tape is discharged. Then, the reel ID of the component tape 90 is deleted from the first reel ID box. Then, no reel ID is registered in each of the first reel ID box and the second ID box and therefore, the display indicating that the presetting is possible is cancelled.

A personal computer that is present away from the surface mounting device 1 may display that presetting is possible. In such a case, the display section 102 and the tape feeder 50 do not display that presetting is possible until the loading is completed; however, the personal computer may display that presetting is possible by determining whether presetting is possible or not only based on the management table 130.

After determining that the component shortage occurs in the state of FIG. 11A, the controller 101 stores the instruction of discharging the component tape 90 and the instruction of loading, and thereafter the controller 101 may display that presetting is possible when the third tape sensor 59 detects the component tape 90.

(5) Determination Process Determining Whether Presetting is Possible

Figure 14:
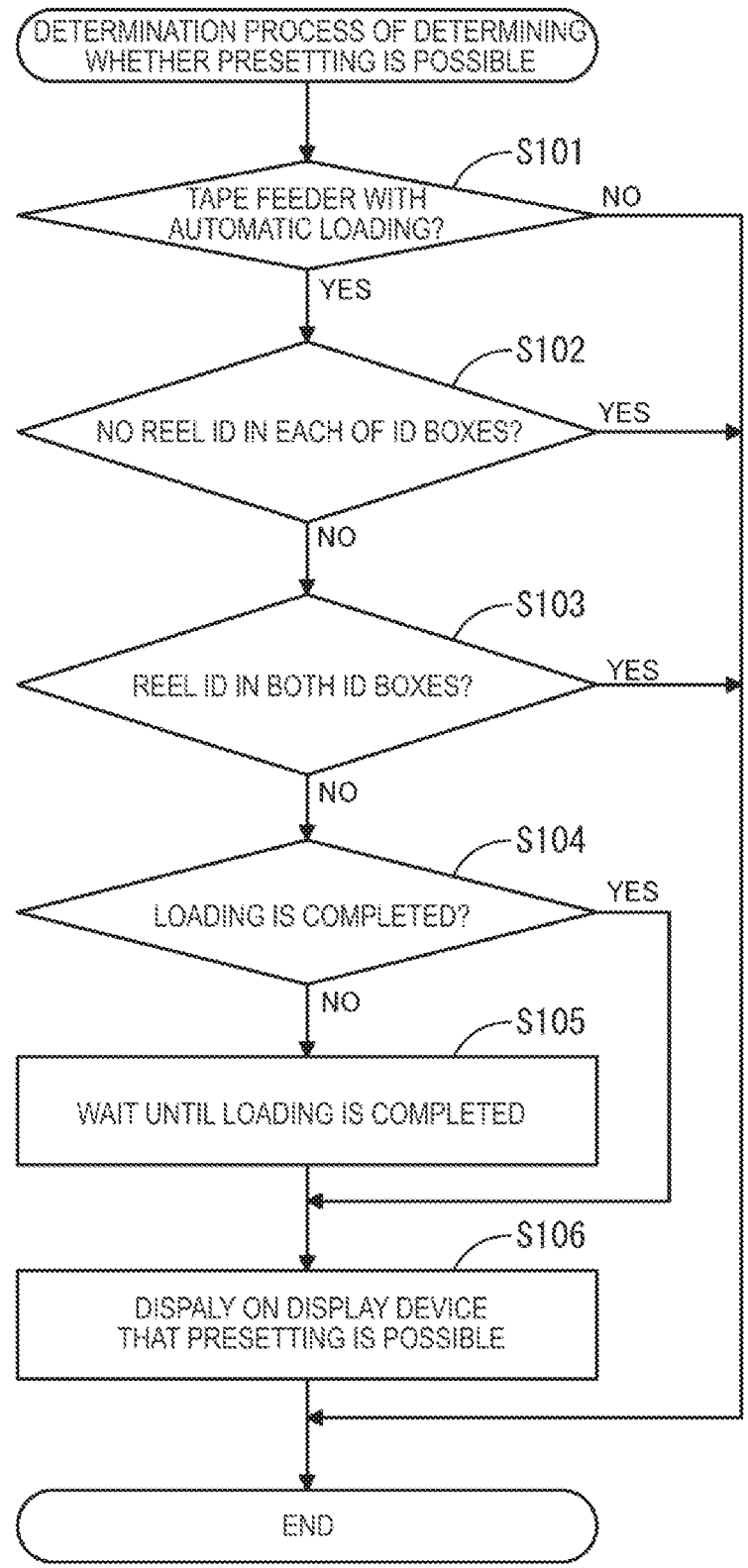
FIG. 14 is a flowchart illustrating a determination process of determining whether presetting is possible.

Next, with reference to FIG. 14, a determination process of determining whether presetting is possible performed by the controller 101 will be described. This process is performed every time the state of the management table 130 described earlier is changed.

In S101, the controller 101 determines whether the target tape feeder 50 has a function of automatically loading the component tape 90. If the controller 101 determines that the target tape feeder 50 has a function of automatically loading the component tape 90, the process proceeds to S102 and otherwise the process is terminated.

In S102, the controller 101 determines whether no reel ID is registered in each of the first reel ID box and the second reel ID box of the management table 130. If the controller 101 determines that the reel ID is registered in at least one of the reel ID boxes, the process proceeds to S103. If determining that no reel ID is registered in each of the reel ID boxes, the controller 101 determines the display indicating that presetting is possible is not necessary and the process is terminated.

In S103, the controller 101 determines whether a reel ID is registered in both of the first reel ID box and the second reel ID box of the management table 130. If the controller 101 determines that the reel ID is registered in only one of the reel ID boxes, the process proceeds to S104. If determining that a reel ID is registered in both of the reel ID boxes, the controller 101 determines that presetting is impossible and the process is terminated.

In S104, the controller 101 determines whether the loading of the component tape 90 that is preset in the first tape feed path 63A is completed according to the detection of the component tape 90 by the third tape sensor 59. If the controller 101 determines that the loading is not completed, the process proceeds to S105 and if determining that the loading is completed, the process proceeds to S106.

In S105, the controller 101 waits until the loading is completed.

In S106, the controller 101 displays on the display section 102 that presetting is possible.

(6) Manner of Displaying that Presetting is Possible

Next, a manner of displaying that presetting is possible will be described. In this embodiment, the display section 102 and the indicator 61 of the tape feeder 50 display that presetting is possible.

(6-1) Display with Display Section

Figure 15:
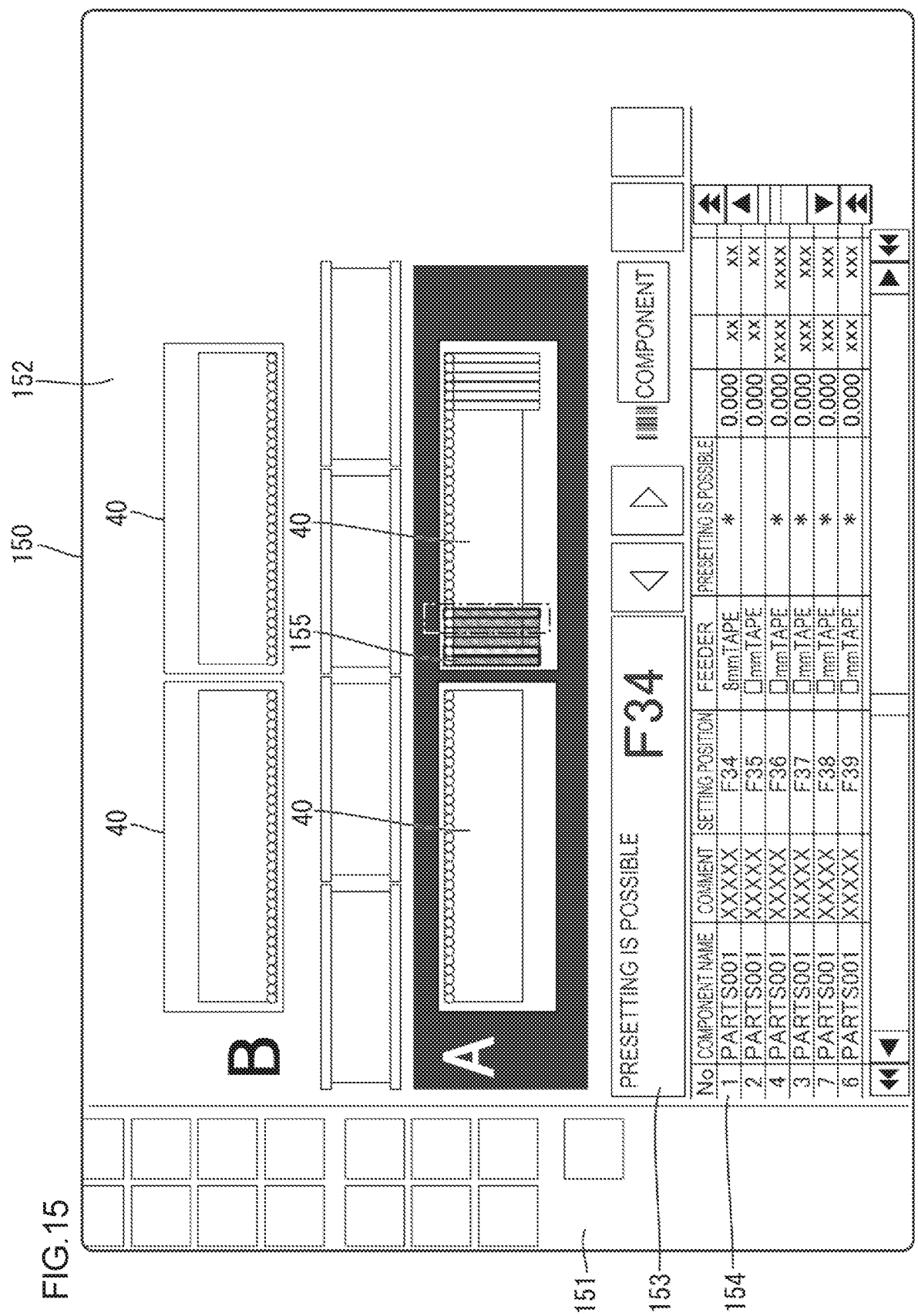
FIG. 15 is a schematic view of a management screen.

FIG. 15 illustrates a management screen 150 displayed on the display section 102. The management screen 150 is a screen for managing the tape feeders 50 and generally includes an operation instruction area 151, a production monitor area 152, a message area 153, and a grid area 154.

The operation instruction area 151 is used by an operator for performing various kinds of operations on the component mounting device 10 and the tape component supply device 40.

The production monitor area 152 is used by an operator for monitoring the state of the tape feeder 50. The production monitor area 152 schematically displays the tape component supply devices 40 that are connected to the component mounting device 10. The tape feeders 50 that are installed in the tape component supply devices 40 are displayed on each of the tape component supply devices 40. Each tape feeder 50 is schematically displayed with a vertically-long rectangular shape 155.

Figure 16:
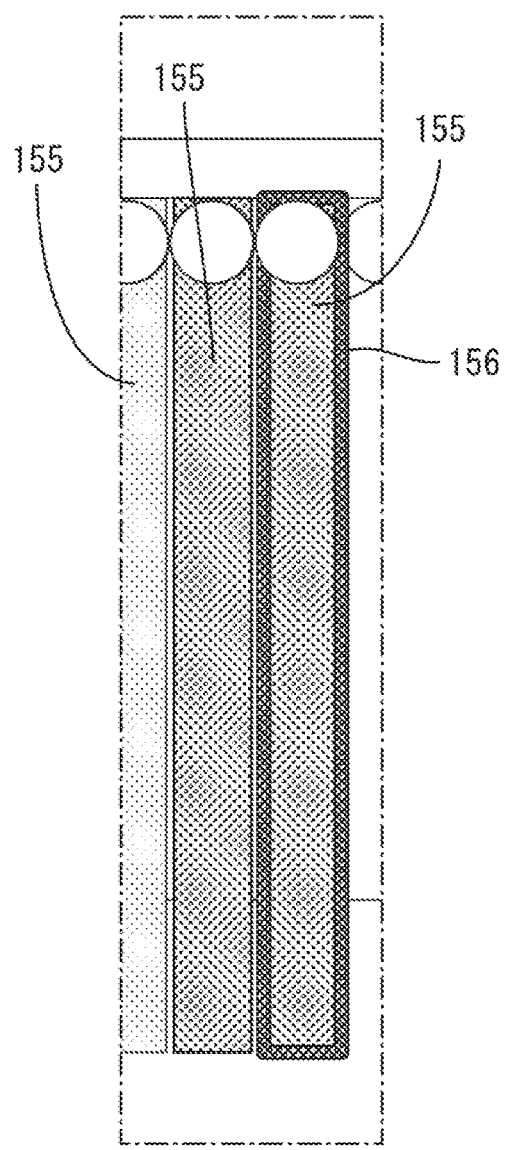
FIG. 16 is an enlarged schematic view of a vertically-long rectangular shape illustrated in FIG. 15.

FIG. 16 is an enlarged view illustrating the vertically-long rectangular shape 155 representing the tape feeder 50. An inner color of the vertically-long rectangular shape 155 represents the number of remaining components E stored in the component tape 90 (namely, the loaded component tape 90) that is supplying the components E. Specifically, similar to the indicator 61 of the tape feeder 50 described earlier, if the remaining of the remaining components E is sufficiently large, the inside of the vertically-long rectangular shape 155 is displayed with green. If the number of the remaining components E is getting smaller, the inside of the vertically-long rectangular shape 155 is displayed with yellow. If the number of the remaining components E is quite small, the inside of the vertically-long rectangular shape 155 is displayed with red.

When the subsequent component tape 90 can be preset in the tape feeder 50, a magenta frame 156 is displayed on the vertically-long rectangular shape 155. Accordingly, the operator can know that the subsequent component tape 90 can be preset in the tape feeder 50. If the subsequent component tape 90 is preset, the magenta frame 156 is deleted.

The color of the frame 156 is not limited to magenta but may be any color as appropriate. The frame 156 may be displayed with blinking.

The message area 153 is an area for displaying various kinds of messages relating the tape feeders 50. The message of "presetting is possible" is displayed on the message area 153 if the tape feeders 50 include at least one tape feeder 50 where a component tape can be preset. If the tape feeders 50 include several tape feeders 50 where component tapes can be preset, the installation position of the tape feeder that is located on the most downstream side (the left side) is also displayed. This massage informs the operator that the subsequent component tape 90 can be preset in at least one tape feeder 50.

The grid area 154 is an area for displaying detailed information relating the tape feeders 50 in a table. The grid includes columns that indicate whether presetting is possible or not. If the tape feeder 50 can receive a component tape to be preset, the corresponding column is filled with "*" that indicates that presetting is possible.

(6-2) Display with Indicator 61 of Tape Feeder

If the subsequent component tape 90 can be preset, a lighting mode of one of the LEDs 70 that is lighted according to the number of the remaining components E included in the component tape 90 that is supplying the components E is switched to blinking as illustrated in FIG. 6. Accordingly, the operator can know that the subsequent component tape 90 can be preset in the tape feeder 50. If the subsequent component tape 90 is preset in the tape feeder 50, the lighting mode of the LED 70 is switched from blinking to lighting.

The display indicating that presetting is possible may not be displayed with blinking but with lighting or may be displayed with flickering.

(7) Advantageous Effects of Embodiment

According to the informing device (the controller 101 and the display section 102) according to the first embodiment as described above, the informing device displays that the subsequent component tape 90 can be preset in the tape feeder 50 if just one component tape 90 is in the tape feeder 50. Thus, the operator can know that the subsequent component tape 90 can be preset. According to the informing device, in the tape feeder 50 that performs loading of the preset component tape 90, utility for the user who presets the component tape 90 can be improved.

Furthermore, the informing device keeps displaying that presetting is possible. Therefore, when the operator stops by the informing device for some work, the operator can easily know that the subsequent component tape 90 can be preset. The operator who knows that the subsequent component tape can be preset can preset the component tape 90 while doing another work. Therefore, the operator need not quit another work to go to the place where the tape feeder 50 is installed every time the tape feeder is in the state in which presetting is possible. According to the informing device, the working efficiency of the operator who presets the component tape 90 can be improved.

According to the informing device, if just one component tape 90 is present in the tape feeder 50, the display section 102 displays that the subsequent component tape 90 can be preset after the one component tape 90 is fed by the loading section 54 and reaches the feeding device 55. Therefore, the operator presets the subsequent component tape 90 after the loading of a preceding component tape 90 is completed. This reduces possibility of presetting of the subsequent component tape 90 during the loading of the preceding component tape 90.

According to the informing device, in the tape feeder 50 including the branched tape feed paths including the first tape feed path and the second tape feed path, the operator can know that the subsequent component tape 90 can be preset in the first tape feed path.

According to the informing device, the display section 102 displays that the subsequent component tape 90 can be preset and also displays information (the color of the inside of the vertically-long rectangular shape 155) on the number of remaining components E stored in the component tape 90 that is supplying the components E. If the number of remaining components E included in the component tape 90 that is supplying the components E is small, it is desirable for the operator to preset the subsequent component tape 90 as soon as possible. According to the informing device, the operator can know the number of remaining components E included in the component tape 90 that is supplying the components E from the information relating the number of remaining components E. Therefore, if the number of remaining components E is small, presetting is performed promptly and the possibility of stopping the mounting operation of the component mounting device 10 due to the component shortage is reduced. Furthermore, according to the informing device, when the subsequent component tape 90 can be preset in several tape feeders 50, one of the tape feeders 50 in which the subsequent component tape 90 is to be preset first can be determined based on the information relating the number of remaining components E.

The informing device displays that the subsequent component tape 90 can be preset in the tape feeder 50 with lighting, blinking, or flickering of the LED 70 of the tape feeder 50 in addition to the display on the display section 102. Therefore, the operator knows whether the subsequent component tape 90 can be preset or not more easily.

Second Embodiment

Figure 17:
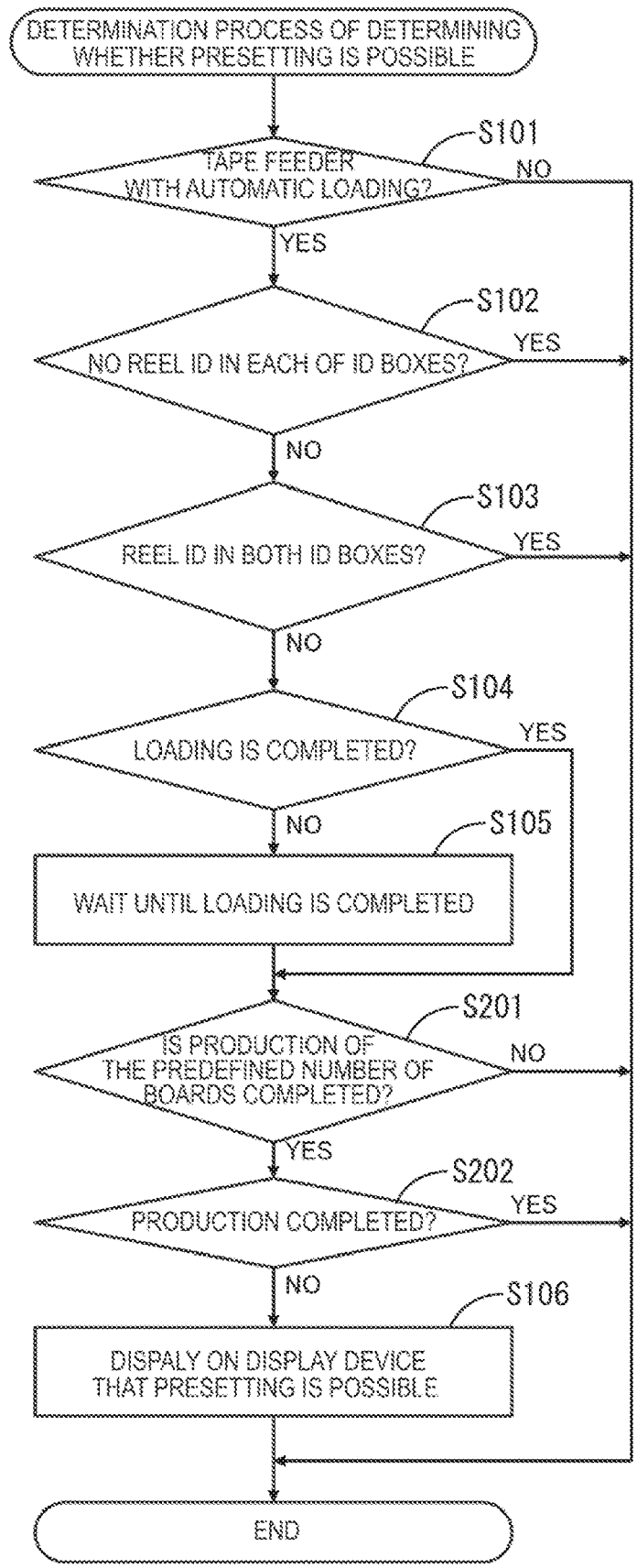
FIG. 17 is a flowchart illustrating a determination process of determining whether presetting is possible according to a second embodiment.

Next, a second embodiment will be described with reference to FIG. 17.

The second embodiment is a modification of the first embodiment. In the second embodiment, the display indicating that presetting is possible is not displayed in the case (A) and the case (B) described below.

(A) After the component mounting device 10 starts mounting of the components E to a first board P (hereinafter, referred to as "production") and until the producing of the predefined number of boards P is finished.

When the production of the board P is started, the operator sets the component tapes 90 in the first tape feed paths 63A of the tape feeders 50, respectively. In such a case, the set component tape 90 is loaded and the subsequent component tape 90 can be preset in each tape feeder 50.

However, when the production is started, the components E are supplied for a while from the component tape 90 that has been set first. It is preferable to set first component tapes 90 in all of the tape feeders 50, respectively, and start production and perform presetting thereafter. If the controller controls to display that the subsequent component tape 90 can be preset in this case, such display may be excessive in some cases. Therefore, the controller 101 controls not to display that presetting is possible until the predefined number of boards P are produced after starting production.

(B) When the component mounting device 10 can produce the scheduled number of boards P with the components E stored in the component tape 90 that is loaded and supplying to the component mounting device 10.

For example, ten boards P are scheduled to be produced and five components E are to be mounted on one board, and if the component tape 90 has component shortage at the time of finishing seven boards P, the component tape 90 that is preset in the first tape feed path 63A is loaded.

In the first embodiment, completion of the loading leads to display that the subsequent component tape 90 can be preset. However, if the loaded component tape 90 includes fifteen components E or more, the rest of the boards P can be produced. Therefore, the subsequent component tape 90 need not be preset. In such a case, the display indicating that presetting is possible may make an operator to perform unnecessary presetting.

The controller 101 compares the number of components E stored in the loaded component tape 90 and the total number of components E to be mounted on the rest of the boards P to be produced. If determining that the number of components E stored in the loaded component tape 90 is equal to or greater than the total number of components E to be mounted on the rest of the boards P to be produced, the controller 101 controls not to display that presetting is possible even if the subsequent component tape 90 can be preset.

Next, with reference to FIG. 17, the determination process of determining whether presetting is possible performed by the controller 101 according to the second embodiment will be described.

S101 to S106 are similar to those of the first embodiment and will not be described.

In S201, the controller 101 determines whether production of the predefined number of boards P is completed after the component mounting device 10 have started the production of a first board P. If it is completed, the process proceeds to S202 and if it is not completed, the indication that presetting is possible is not displayed and the process is terminated.

In S202, the controller 101 determines whether the component mounting device 10 can complete the production of the scheduled number of boards P with the components E stored in the loaded component tape 90. If such production cannot be completed, the process proceeds to S106 and if it can be completed, the indication that presetting is possible is not displayed and the process is terminated.

According to the informing device in the second embodiment described above, the display section 102 does not display that a subsequent component tape 90 can be preset before the mounting of the components E onto the predefined number of boards P is completed after the component mounting device 10 has started mounting the component E onto the first board P. This suppresses an excessive number of times of display.

According to the informing device, if the component mounting device 10 can complete the mounting of the components E onto the scheduled number of boards P with the components E stored in the component tape 90 that is supplying the components E, the display section 102 does not display that a subsequent component tape 90 can be preset. This prevents an operator from performing unnecessary presetting.

Third Embodiment

Figure 18:
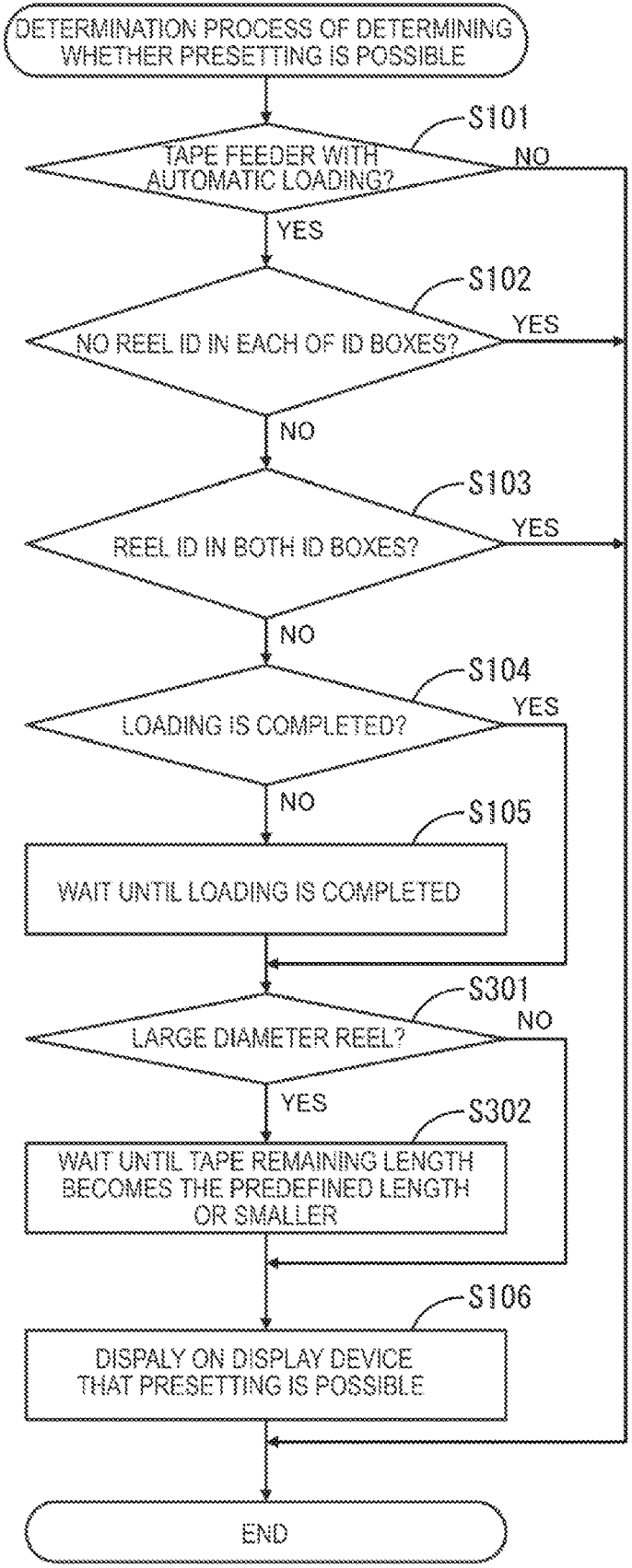
FIG. 18 is a flowchart illustrating a determination process of determining whether presetting is possible according to a third embodiment.

Next, a third embodiment will be described with reference to FIG. 18.

The tape component supply device 40 may have a small space for receiving the reels 42. If the reel 42 has a small diameter (the reel 42 having a diameter smaller than a reference value), two reels 42 can be installed in the space at the same time. However, if the reel 42 has a large diameter (the reel 42 having a diameter of the reference value or larger), two reels 42 may not be installed in the space at the same time. In such a case, even if the indication that presetting is possible is displayed at the timing that the loading of the component tape 90 is completed, an operator cannot preset another component tape 90 since the reel 42 around which the loaded component tape 90 is wound is already installed.

Therefore, if the reel 42 around which the component tape 90 is wound is a large diameter reel 42, the controller 101 in the third embodiment displays that presetting is possible at different timing from the first embodiment. Details will be described below.

As is in the case A described in the first embodiment, if no component tape 90 is in the first tape feed path 63A and the second tape feed path 63B and the component tape 90 is set in the first tape feed path 63A, the component tape 90 is loaded by the loading section 54. In the third embodiment, when the loading of the component tape 90 that is wound around a small diameter reel 42 is completed, the indication that a subsequent component tape 90 can be preset is displayed.

On the other hand, even if the loading of the component tape 90 that is wound around a large diameter reel 42 is completed, the indication that presetting is possible is not displayed immediately. If the components E are supplied from the loaded component tape 90 and a length of the remaining component tape 90 is a predefined length or smaller, the indication that presetting is possible is displayed. The predefined length may be represented by meters (m) or the number of remaining components E included in the component tape 90.

In such a case, an operator who knows that presetting is possible switches the tape feed path for the loaded component tape 90 to the second tape feed path 63B. However, the rest (a length of the remaining portion) of the component tape 90 is still wound around the large diameter reel 42. Therefore, the reel 42 of the subsequent component tape 90 cannot be installed in the space.

After switching the tape feed path for the loaded component tape 90 to the second tape feed path 63B (or before switching), the operator releases the rest of the component tape 90 from the reel 42 and detaches only the reel 42. This provides a space that can receive the reel 42 of the subsequent component tape 90. After only the reel 42 is detached, the rest of the component tape 90 hangs on the tape feeder 50 while being spirally curled. The rest of the component tape 90 is short and the components E can be supplied without any problems.

Then, the operator installs the reel 42 of the subsequent component tape 90 and presets the component tape 90 that is wound around the reel 42 in the first tape feed path 63A. Thus, the subsequent component tape 90 can be preset before the component shortage of the loaded component tape 90.

Next, with reference to FIG. 18, the determination process of determining whether presetting is possible performed by the controller 101 according to the third embodiment will be described.

S101 to S106 are similar to those of the first embodiment and will not be described.

In S301, the controller 101 determines whether the reel is the large diameter reel 42. If the reel is not the large diameter reel 42, the process proceeds to S106. If the reel is the large diameter reel 42, the process proceeds to S302.

In S302, the controller 101 waits until the length of the remaining component tape 90 becomes the predefined length or smaller and if the length of the remaining component tape is the predefined length or smaller, the process proceeds to S106.

According to the informing device in the third embodiment described above, if the length of the remaining component tape 90 that is wound around the large diameter reel 42 becomes the predefined length or smaller, the indication that presetting is possible is displayed. Therefore, even if two large diameter reels 42 cannot be installed at the same time, the operator can preset the subsequent component tape 90 before the number of remaining components E included in the component tape 90 (namely, the loaded component tape 90) that is supplying the components E becomes zero.

Fourth Embodiment

Next, a fourth embodiment will be described with reference to FIG. 19.

The informing device according to the fourth embodiment collectively monitors the number of remaining components E included in each of the component tapes 90 that are used in the surface mounting devices 1 (all of the surface mounting devices 1). In the following description, the informing device according to the fourth embodiment is referred to as a component remaining number monitor.

The component remaining number monitor is a so-called personal computer that includes a CPU, a ROM, a RAM, a communication section, a display section (such as a liquid crystal display), and an operation section (such as a keyboard, a mouse, a touch panel). The component remaining number monitor is connected to the server 120, which is described in the first embodiment, via a communication network so as to communicate.

FIG. 19 is a component remaining number monitor screen 170 that is displayed on a display section of the component remaining number monitor. The component remaining number monitor screen 170 displays a grid area 171 in which information on the tape feeders 50 installed in each of the tape component supply devices 40 that are disposed on one floor is displayed. The screen 170 includes boxes indicating whether presetting is possible or not and if the tape feeder 50 is in a state that presetting is possible, "*" indicating that presetting is possible is displayed in a corresponding box.

On the component remaining number monitor screen 170, a background of a row including information on each of the tape feeders 50 is displayed with a color according to the number of remaining components E included in the component tape 90 that is inside the tape feeder 50 and supplying the components E (namely, the loaded component tape 90).

However, on the component remaining number monitor screen 170, the frame color of each row cannot be changed. Therefore, for example, the characters for the information on the tape feeder 50 that is in a state in which presetting is possible are displayed with magenta. The background color of the row for the tape feeder 50 that is in a state in which presetting is possible may be changed. The tape feeder 50 that is in a state in which presetting is possible may be displayed with any other method as appropriate.

According to the component remaining number monitor in the fourth embodiment described above, the operator can check a list for the component mounting devices 10 to find the tape feeders 50 in which the subsequent component tapes 90 can be preset.

Fifth Embodiment

Next, a fifth embodiment will be described with reference to FIG. 20.

As described earlier, the tape component supply device 40 includes the casters 46. Therefore, the operator can move the tape component supply device 40 to another place away from the component mounting device 10 (for example, a warehouse for the component tapes 90) and set the component tape 90 into each tape feeder 50 (hereinafter, referred to as off-line set-up). The informing device according to the fifth embodiment informs an operator of the component tape 90 that is to be set in each tape feeder 50 at the time of the off-line set-up. In the following description, the informing device according to the fifth embodiment is referred to as an off-line set-up device.

The off-line set-up device is a so-called personal computer that includes a CPU, a ROM, a RAM, a communication section, a display section (such as a liquid crystal display), and an operation section (such as a keyboard, a mouse, a touch panel). The off-line set-up device is connected to the server 120, which is described in the first embodiment, via a communication network so as to communicate.

Figure 20:
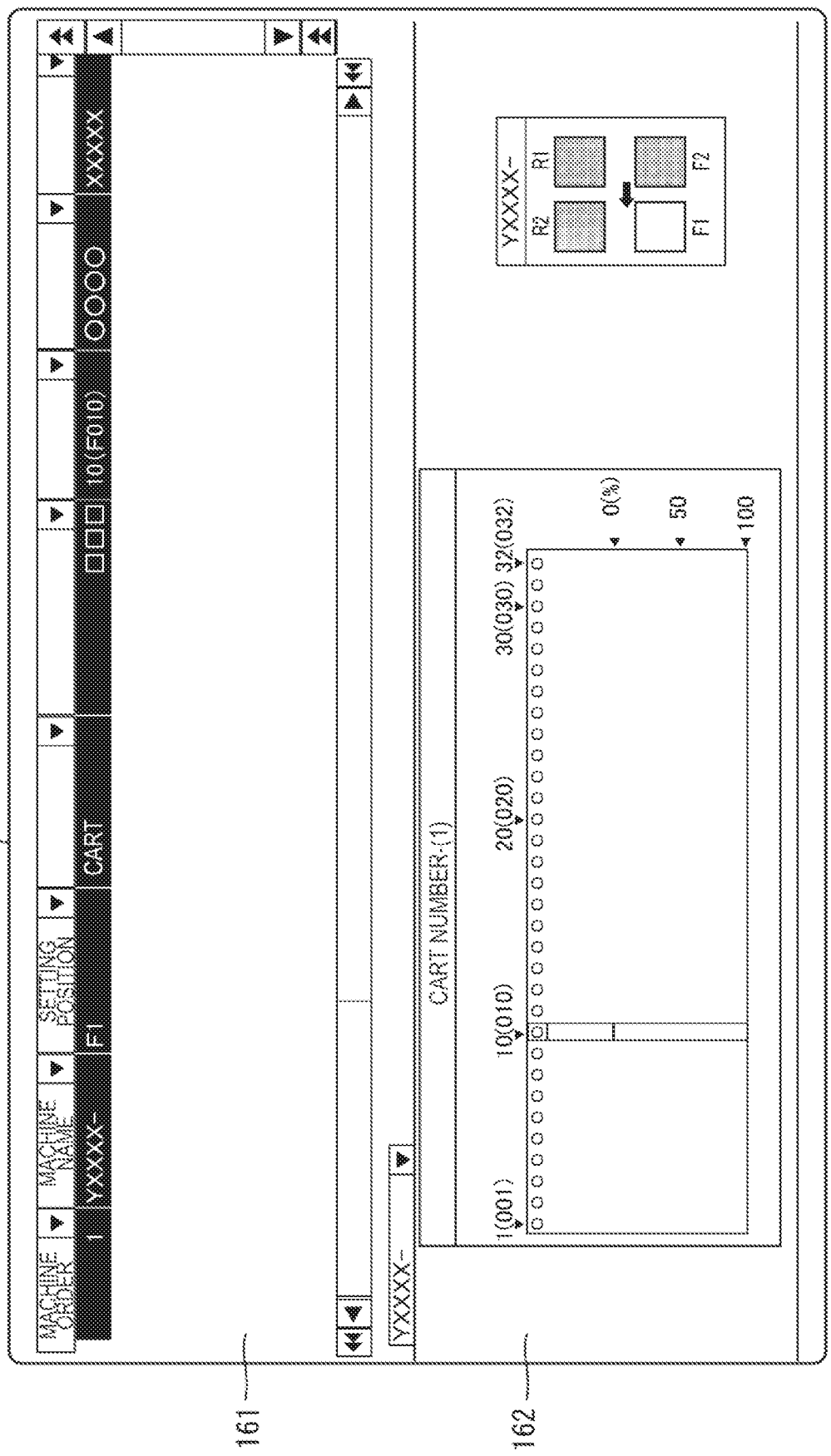
FIG. 20 is a schematic view of an off-line set-up navigation screen according to a fifth embodiment.

FIG. 20 illustrates an off-line set-up navigation screen 160 displayed on the display section of the off-line set-up device. The off-line set-up navigation screen 160 includes a grid area 161 similar to the grid area 154 in the first embodiment and a display area 162 that schematically displays the tape component supply device 40.

In the off-line set-up operation, an operator reads the feeder ID and the reel ID with the barcode reader and the read IDs are transmitted to the server 120 and registered in the management table 130. However, the off-line set-up device cannot obtain detection signals of the tape sensors from the tape component supply device 40. Therefore, the off-line set-up device determines whether presetting is possible or not only based on the management table 130.

Specifically, if no component tape 90 is in the first tape feed path 63A and the second tape feed path 63B and the operator sets the component tape 90 in the first tape feed path 63A, the reel ID is registered in the first reel ID box. If the management table is changed to the state in which the reel ID is registered only in the first reel ID box, the controller 101 controls to display that presetting is possible. A manner of displaying that presetting is possible is substantially same as that in the first embodiment and will not be described.

The operator notices that presetting is possible and operates a loading button included in the tape feeder 50 to perform the loading. Then, the operator switches the tape feed path for the component tape 90 to the second tape feed path 63B and presets a subsequent component tape 90 in the first tape feed path 63A.

If the subsequent component tape 90 is preset, the reel IDs are registered in the first reel ID box and the second reel ID box, respectively. If the management table is in this state, the controller 101 cancels the display indicating that presetting is possible.

The off-line set-up device that may be connected to the tape component supply device 40 via the connection cable may obtain detection signals of the tape sensors from the tape component supply device 40. In such a configuration, the controller 101 of the off-line set-up device checks the detection signals of the tape sensors.

According to the off-line set-up device in the fifth embodiment described above, the working efficiency of the operator who presets the component tape 90 can be improved when the tape component supply device 40 is moved to another place away from the component mounting device 10 and sets the component tape 90 in each tape feeder 50.

OTHER EMBODIMENTS

The technology described herein is not limited to the embodiments described in the above description and the drawings. The following embodiments may be included in the technical scope of the technology described herein, for example.

(1) The first embodiment includes the detachable switching member 53 as the switching member; however, it is one example and the switching member is not limited to the one. For example, the switching member may be opened in the right-left direction by an operator's operation. In such a configuration, the switching member is opened in the right-left direction so that the component tape 90 that is set (or preset) in the first tape feed path 63A drops down. Thus, the tape feed path is switched from the first tape feed path 63A to the second tape feed path 63B.

(2) In the first embodiment, the operator manually switches the tape feed path for the component tape 90 from the first tape feed path 63A to the second tape feed path 63B by the operator's attachment or detachment of the switching member 53. The switching member may be configured to automatically switch the tape feed path to the second tape feed path 63B at the time of completion of the loading. For example, in the switching member that is configured to be opened in the right-left direction, the switching member may be opened in the right-left direction by the motor to automatically switch the tape feed path to the second tape feed path 63B.

(3) The manner of displaying that presetting is possible described earlier is one example and is not limited to the above one. The display manner indicating that presetting is possible may be altered as appropriate.

(4) In the above embodiments, the informing section keeps displaying and informing that the subsequent component tape can be preset until the subsequent component tape is preset. However, the informing section may inform for a certain period or intermittently before the subsequent component tape is preset.

(5) In the above embodiments, the tape feed path includes the first tape feed path and the second tape feed path. However, the tape feed path may not be branched into two and two component tapes may be inserted in one tape feed path.

(6) In the above embodiments, the display section 102 displays and informs that the component tape 90 can be preset but may inform with informing noise, for example.

What is claimed is:
1. An informing method comprising:
inserting a first component tape extending from a first tape reel into a tape feeder through a tape inlet cavity that is continuous to a tape feed cavity;
determining whether the first component tape is detected by a first sensor that is disposed near the tape inlet cavity;
storing first identification information related to the first tape reel in first information storage in response to a determination that the first component tape is detected by the first sensor;
in response to a determination that the first component tape is detected by the first sensor, feeding the first component tape from the tape inlet cavity along the tape feed cavity toward a tape outlet of the tape feeder;
determining whether the first component tape is detected by a second sensor disposed near the tape outlet; and
in response to a determination that the first component tape is detected by the second sensor, informing that a second component tape can be set in the tape feeder.

2. The informing method according to claim 1, further comprising steps of:
after the informing, inserting the second component tape into the tape feeder through the tape inlet cavity;
determining whether the second component tape is detected by the first sensor;
in response to a determination that the second component tape is detected by the first sensor, moving the first identification information from the first information storage to a second information storage and storing second identification information related to a second tape reel including the second component tape in the first information storage.

3. The method according to claim 1, wherein
in the inserting of the first component tape, attaching a defining member in the tape inlet cavity to define a first tape inlet cavity and a second tape inlet cavity and inserting the first component tape into the first tape inlet cavity, and
after the determination that the first component tape is detected by the second sensor and the informing, detaching the defining member to move the first component tape and attaching the defining member again to set the first component tape in the second tape inlet cavity.

4. The method according to claim 2, further comprising steps of:
in response to a determination that the first component tape is not detected by the second sensor, deleting the first identification information from the second information storage;
feeding the second component tape from the tape inlet cavity toward the tape outlet of the tape feeder;
determining whether the second component tape is detected by the second sensor; and
in response to a determination that the second component tape is detected by the second sensor and a determination that no identification information is stored in the second information storage and the second identification information is stored in the first information storage, informing that a component tape can be set in the tape feeder.

5. A surface mounting device comprising:
a tape component supplier including
a reel support member in which a first tape reel including a first component tape and a second tape reel including a second component tape can be set,
a tape feeder that includes
a body member including
a tape feed cavity in which at least one of the first component tape and the second component tape is fed,
a tape inlet hole that is at one end of the tape feed cavity,
a tape inlet cavity that is continuous from the tape inlet hole and continuous to the tape feed cavity and in which the first component tape and the second component tape can be inserted, and
a tape outlet that is at another end of the tape feed cavity and through which the first component tape and the second component tape can be discharged from the feeder,
the tape feeder further including
a first feeder disposed near the tape inlet cavity and configured to feed the first component tape or the second component tape to the tape feed cavity,
a first sensor disposed near the first feeder and configured to detect presence of the first component tape or the second component tape,
a first motor configured to drive the first feeder, and
a second sensor arranged near the tape outlet and configured to detect presence of the first component tape or the second component tape; and
a component mounter including
an informing apparatus,
a memory including first information storage configured to store first identification information that is related to one of the first tape reel or related to the second tape reel and second information storage configured to store second identification information that is related to another one of the first tape reel or the second tape reel, and
a controller configured to
in response to a determination that presence of the first component tape is detected by the first sensor, store the first identification information related to the first tape reel in the first information storage,
after the determination that the presence of the first component tape is detected by the first sensor, control the first motor to drive the first feeder to feed the first component tape along the tape inlet cavity toward the tape outlet along the tape feed cavity,
determine whether identification information is stored in the first information storage and the second information storage,
determine whether presence of the first component tape is detected by the second sensor,
in response to a determination that no identification information is stored in the second information storage and the first identification information is stored in the first information storage and a determination that the presence of the first component tape is detected by the second sensor, control the informing apparatus to inform information representing that the second component tape can be set in the tape feeder.

6. The surface mounting device according to claim 5, wherein the controller is configured to control the informing apparatus to inform the information representing that the second component tape can be set in the tape feeder until determining that the second identification information related to the second tape reel is stored in the second information storage.

7. The surface mounting device according to claim 5, wherein
the tape feeder further includes a defining member that is detachably arranged in the tape inlet hole and defines the tape inlet hole to a first tape inlet cavity and a second tape inlet cavity that is adjacent to the first inlet cavity,
the first tape inlet cavity is continuous to the tape inlet hole and the tape feed cavity and the first component tape or the second component tape is inserted through the first tape inlet cavity to the tape feed cavity, and
the second tape inlet cavity is continuous to the tape inlet hole and the tape feed cavity and the first component tape or the second component tape is inserted through the second tape inlet cavity to the tape feed cavity.

8. The surface mounting device according to claim 5, wherein the controller is configured to control the informing apparatus to further inform information on a number of remaining components stored in the first component tape.

9. The surface mounting device according to claim 5, wherein
the tape feeder further includes a light emitter, and
the controller is configured to control the light emitter to be lighted on in response to a determination that the first identification information is stored in the first information storage and no identification information is stored in the second information storage.

10. The surface mounting device according to claim 5, wherein the controller is configured to control the informing apparatus not to inform that the second component tape can be set in the tape feeder until mounting of the components on a predefined number of boards is completed after the component mounter starts mounting the components on a first board.

11. The surface mounting device according to claim 5, wherein the controller is configured to control the informing apparatus not to inform that the second component tape can be set in the tape feeder when the component mounter can complete mounting of the components on a scheduled number of boards with the components stored in the first component tape.

12. The surface mounting device according to claim 5, wherein the controller is configured to
- move the first identification information that is stored in the first information storage to the second information storage in response to a determination that presence of the first component tape is detected by the second sensor,
- in response to a determination that presence of the second component tape is detected by the first sensor, store the second identification information related to the second tape reel in the first information storage and control the first motor to drive the first feeder to feed the second component tape through the tape inlet cavity toward the tape outlet along the tape feed cavity,
- determine whether identification information is stored in the first information storage and the second information storage, and
- in response to a determination that the second identification information is stored in the first information storage and the first identification information is stored in the second information storage, control the informing apparatus to stop informing the information.

13. The surface mounting device according to claim 12, wherein the controller is configured to
- in response to a determination that no presence of the first component tape is detected by the second sensor, delete the first identification information from the second information storage, and
- in response to a determination that no identification information is stored in the second information storage and the second identification information is stored in the first information storage, control the informing apparatus to inform the information representing that a component tape can be set in the tape feeder.

* * * * *